United States Patent [19]
Nakamori et al.

[11] Patent Number: 5,488,625
[45] Date of Patent: Jan. 30, 1996

[54] SEMICONDUCTOR LASER DEVICE HAVING CHIP-MOUNTED HEATING ELEMENT

[75] Inventors: Tomohiro Nakamori, Ichikawa; Hiroshi Hashimoto, Tokyo; Soya Endo, Tokyo; Hitoshi Machino, Tokyo; Masanori Ishizu, Yokohama, all of Japan

[73] Assignee: Canon Kabushiki Kaisha, Tokyo, Japan

[21] Appl. No.: 131,677

[22] Filed: Oct. 5, 1993

[30] Foreign Application Priority Data

| Oct. 7, 1992 | [JP] | Japan | 4-268863 |
| Oct. 7, 1992 | [JP] | Japan | 4-268864 |
| Oct. 7, 1992 | [JP] | Japan | 4-268865 |
| Nov. 13, 1992 | [JP] | Japan | 4-303564 |

[51] Int. Cl.[6] .................................................. H01S 3/025
[52] U.S. Cl. ............................. 372/50; 372/43; 372/97
[58] Field of Search ............................. 372/43–50, 97, 372/31

[56] References Cited

U.S. PATENT DOCUMENTS

| 4,359,773 | 11/1982 | Swartz et al. | 372/43 X |
| 5,105,433 | 4/1992 | Eisele et al. | 372/50 |
| 5,140,605 | 8/1992 | Paoli et al. | 372/50 |
| 5,197,076 | 3/1993 | Davis et al. | 372/43 X |
| 5,262,658 | 11/1993 | Jankowski | 372/50 X |
| 5,267,255 | 11/1993 | Paoli | 372/50 |

OTHER PUBLICATIONS

S. Yamamoto et al., "Visible GaAlAs V–channelled Substrate Inner Stripe Laser with Stabilized Mode Using p–GaAs Substrate", Applied Physics Letters vol. 40, No. 5, pp. 372–374, 1 Mar. 1982.

*Primary Examiner*—John D. Lee
*Attorney, Agent, or Firm*—Fitzpatrick, Cella, Harper & Scinto

[57] ABSTRACT

A semiconductor device includes a chip, a laser element formed on the chip and a heating element formed on the chip. The laser element is driven to emit a laser beam upon light-on of a laser. Upon light-off of a laser, switching is made so that the heating element is driven so as not to emit the laser beam in the normal laser beam emission direction by the laser element.

12 Claims, 24 Drawing Sheets

F I G. 1
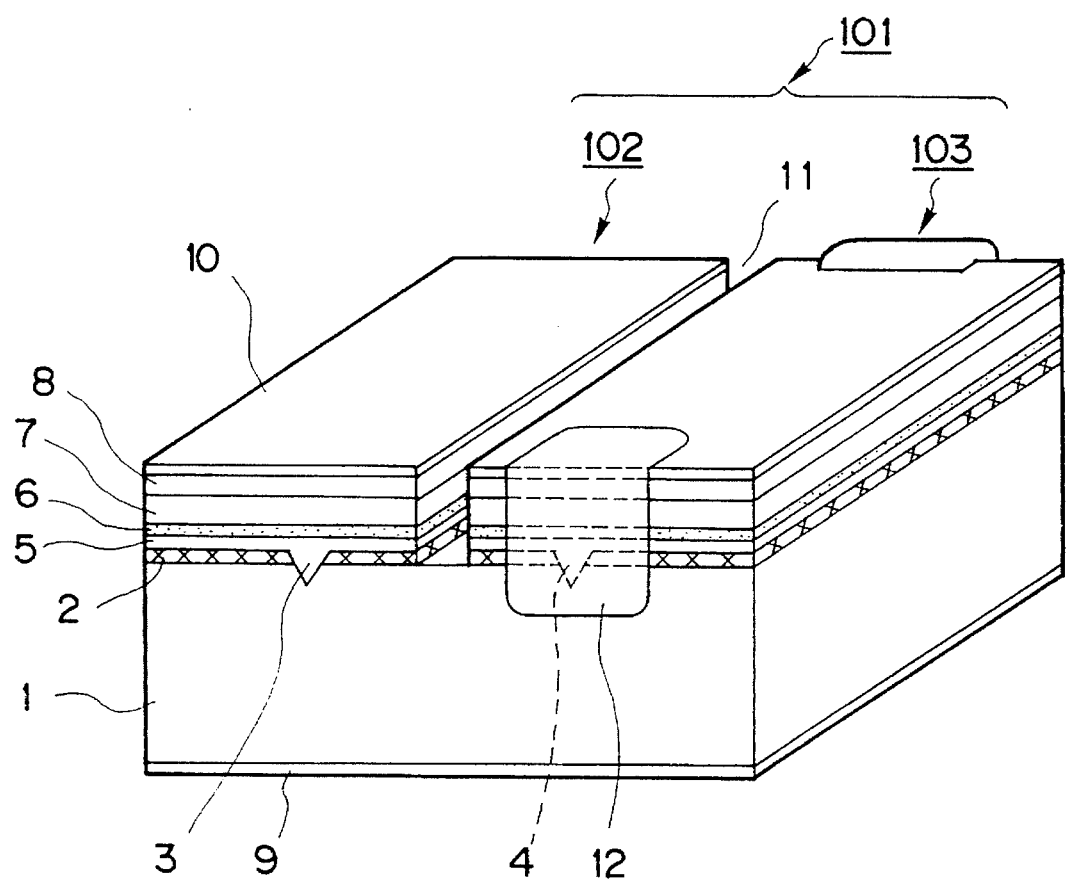

F I G. 12
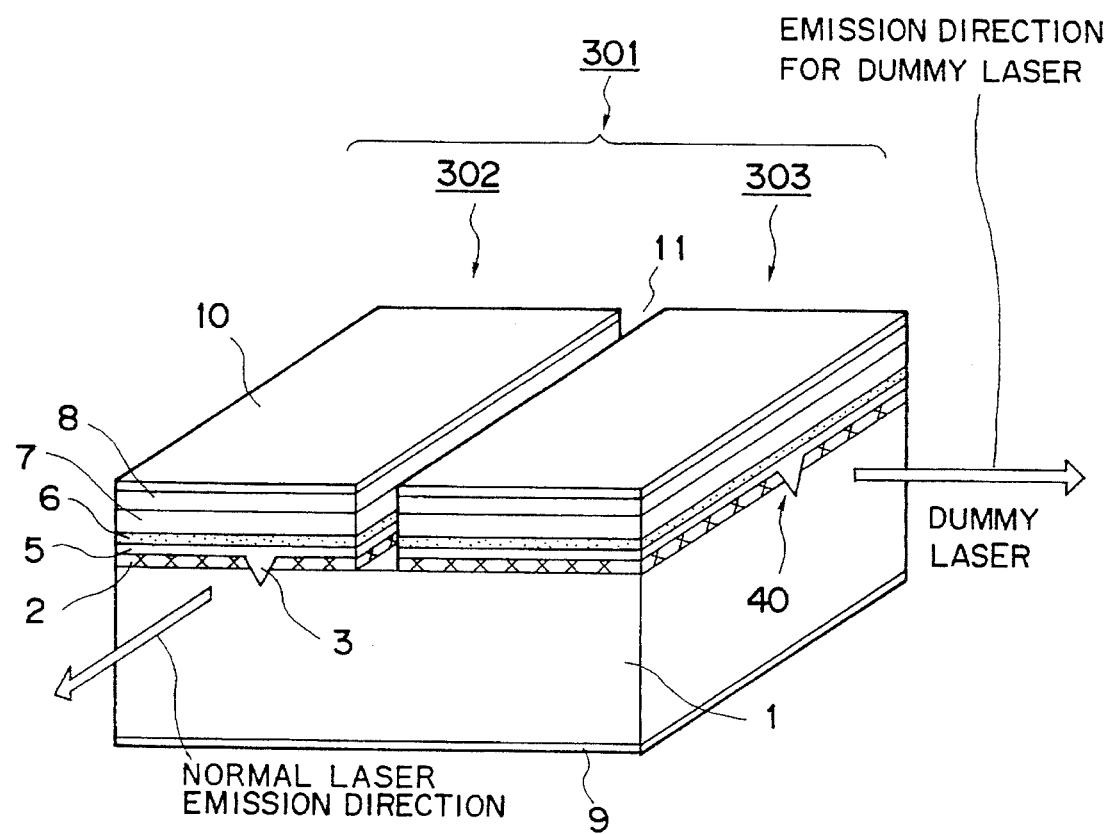

SEMICONDUCTOR LASER DEVICE HAVING CHIP-MOUNTED HEATING ELEMENT

BACKGROUND OF THE INVENTION

1. Field of the Invention

The invention relates to a semiconductor laser device which is used in exposing means or the like of an electrophotographic apparatus.

2. Related Background Art

Hitherto, a laser element provided on a chip of a semiconductor laser device is either on to irradiate a laser beam or it is off.

In the above conventional element, however, at a time when the laser element is turned on to emit a laser beam, laser beam power decreases because of the heating of the chip. In cases where such a laser element is used as exposing means in an electrophotographic apparatus of a laser beam printer or the like, such a decrease in laser beam power causes unwanted image density fluctuation.

SUMMARY OF THE INVENTION

In consideration of the above problem, it is an object of the invention to provide a semiconductor laser device in which even when a laser element is switched from a light-off state to a light-on state, an electric power which is consumed by a chip is made constant, thereby preventing drop-off of laser beam power at the time of light-on and also providing a semiconductor laser system which can be purposely controlled.

A semiconductor laser system of the invention comprises: a semiconductor laser device in which an element unit which is constructed by a laser element and a heating element to heat a chip is formed on one chip; and a control device for driving the laser element at the time of light-on of a laser and for switching and driving the heating element at the time of light-off of the laser.

Preferably, a plurality of element units are formed on the chip, and the heating element is a heating laser element or diode element which is formed separately from the laser element so as not to emit a laser beam in the normal laser beam emission direction. The control device preferably has a constant current source and a differential switch to perform a switching operation by the constant current source. More preferably, the control device has: a constant current source; a differential switch to execute the switching driving operation by the constant current source; and a resistor or variable resistor for by-passing a part of the current flowing in the heating element.

The control device drives the laser element at the time of laser light-on and switchingly drives the heating element at the time of the laser turn-off, so that the chip on which both of the laser element and the heating element are formed is held to a predetermined temperature. Consequently, even when the laser element in the turned-off state is turned on, the laser beam power is not decreased at the time of turn-on.

According to a semiconductor laser device of the invention, a plurality of laser elements are formed on one chip and an emitting port of at least one of the plurality of laser elements is covered by a shielding member so that a laser beam cannot be irradiated to the outside.

Or, a plurality of laser elements are formed on one chip and the direction of an optical axis of at least one of the plurality of laser elements is set to a direction which is deviated from the optical axis directions of the other laser beams.

A plurality of laser elements are formed on one chip, either one of the plurality of laser elements is set to a dummy laser element which doesn't emit a laser beam to the outside or which emits a laser beam in a direction other than the normal emission direction, and the other remaining laser elements are set to normal laser elements. Only when the normal laser elements are turned off, the dummy laser element is turned on. Therefore, a predetermined electric power consumption occurs on the chip irrespective of the turn-on or turn-off of the normal laser elements and the chip is held to a predetermined temperature. Consequently, a situation such that the chip is heated at the start of the activation of the normal laser element and the laser beam power decreases doesn't occur.

According to the semiconductor laser device of the invention, a laser element and a diode element are formed on the same chip. Preferably, when the diode element is connected to the power source to which the laser element is connected, the diode element generates a heat amount that is almost equal to a heat amount which is generated when the laser element generates a laser beam.

When the laser element is on, the diode element is made inoperative. When the laser element is off, a current is supplied to the diode element, so that the same heat is given to the semiconductor chip.

According to the invention, heat generating means is provided in the same package of the semiconductor laser and a current is supplied to the heating means in the laser turned-off state, thereby reducing a temperature difference on the chip in the laser turned-on state and laser turned-off state and decreasing a change in light power due to the heat which is generated during the laser turned-on state.

BRIEF DESCRIPTION OF THE DRAWINGS

FIG. 1 is a constructional diagram showing a laser chip constructing one element unit of a semiconductor laser device which is used in the first embodiment of the invention;

FIG. 12 is a diagram showing a structure of a laser chip in the fifth embodiment;

DETAILED DESCRIPTION OF THE PREFERRED EMBODIMENTS

Figure 2:
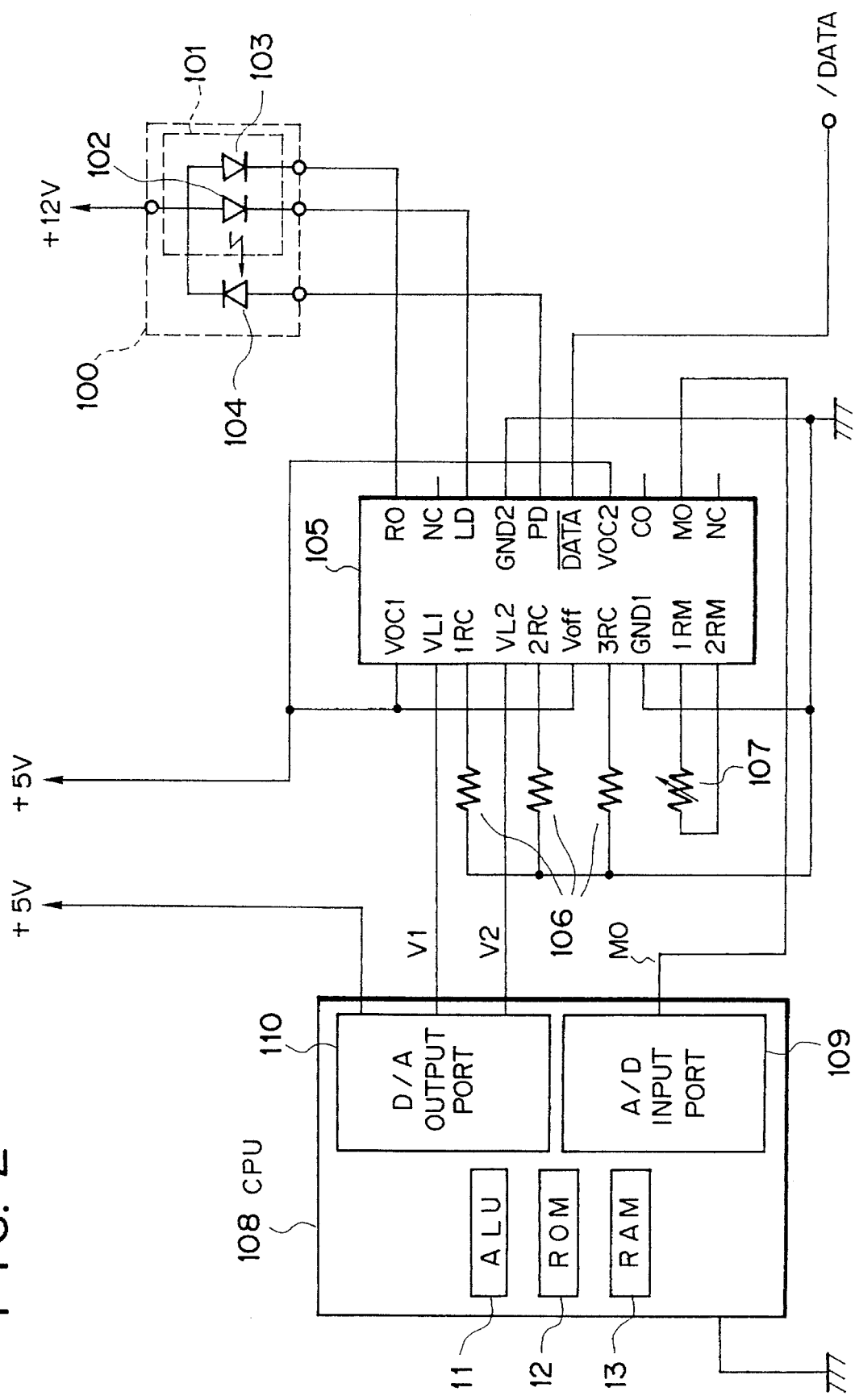
FIG. 2 is a block diagram showing the first embodiment of a semiconductor laser system of the invention.
Figure 3:
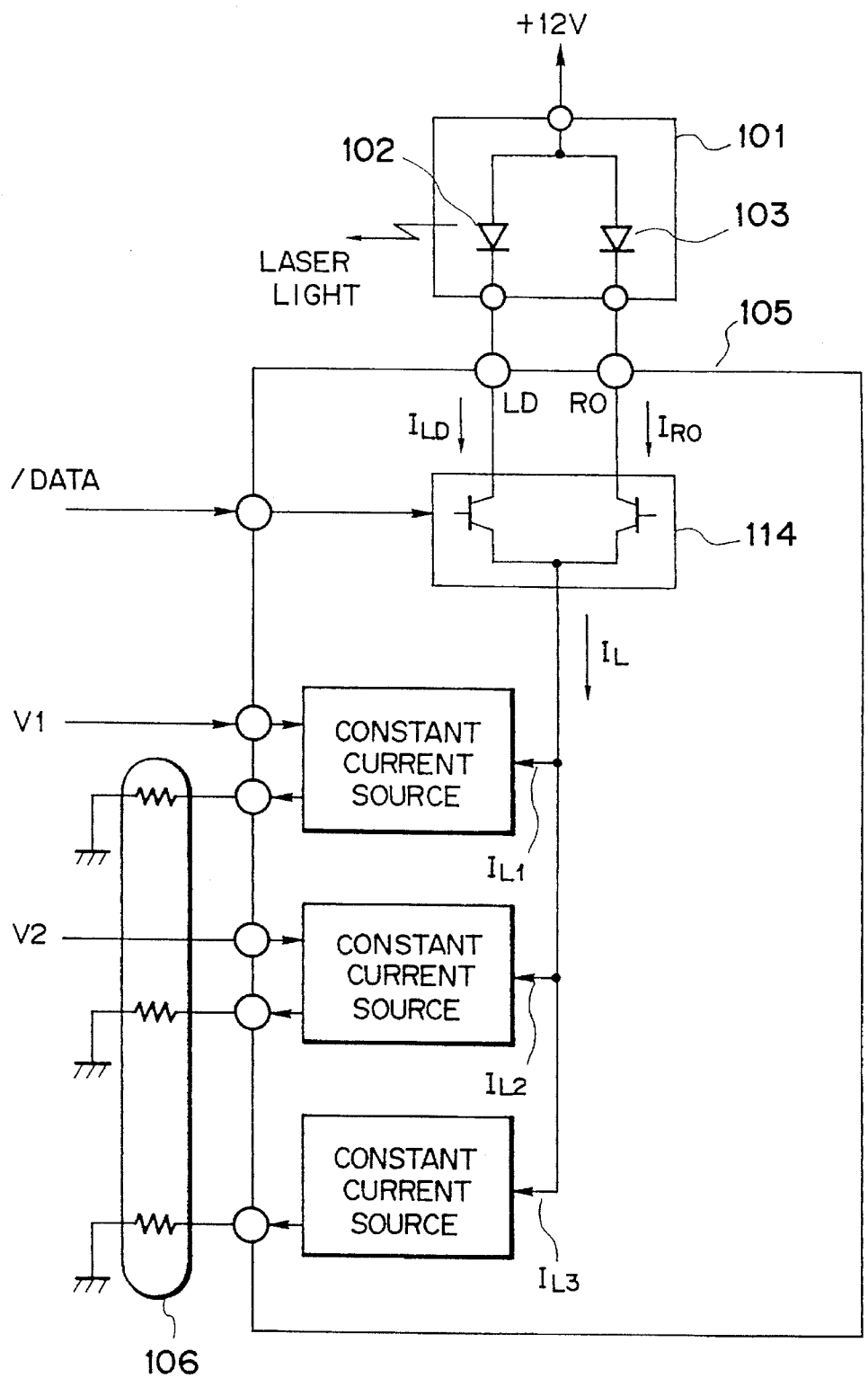
FIG. 3 is a block diagram showing the details of a semiconductor laser driver in FIG. 2.
Figure 4:
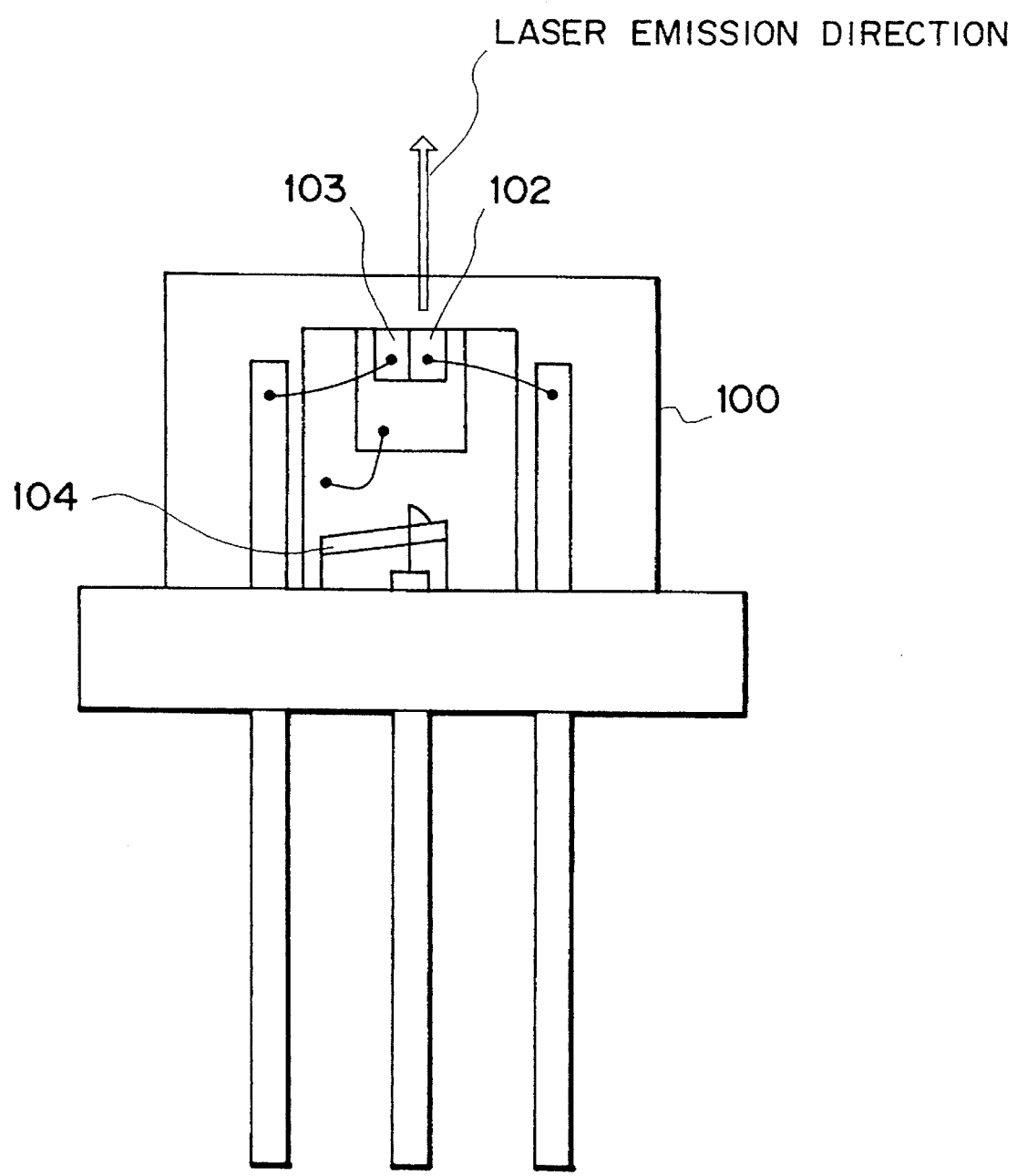
FIG. 4 is a diagram showing a construction of the semiconductor laser device which is used in the first embodiment of the invention.

Embodiments of the invention will now be described hereinbelow with reference to the drawings. FIG. 1 is a constructional diagram showing an element unit of a semiconductor laser device used in the first embodiment of the invention. FIG. 2 is a block diagram showing the first embodiment of a semiconductor laser system of the invention. FIG. 3 is a block diagram showing in detail a semiconductor laser driver in FIG. 2. FIG. 4 is a diagram showing a construction of the semiconductor laser device used in the first embodiment of the invention.

An element unit 101 of a semiconductor laser device of FIG. 1 is a laser chip which is fundamentally based on an internal stripe structure semiconductor element such that an n-type current blocking layer is deposited on a p-type substrate and a V-shaped groove is etched ("Applied Physics, Lett.", Vol. 40, page 372, Mar. 1, 1982). In FIG. 1, reference numeral 1 denotes a p-type GaAs substrate; 2 an n-type GaAs current blocking layer; 3 and 4 stripe grooves formed by a well-known photolithography technique. The current blocking layer 2 in each of the stripe layers 3 and 4 is eliminated and this portion is used as a current path. Reference numeral 5 denotes a p-$Ga_{1-Y}Al_YAs$ clad layer; 6 a $Ga_{1-Y}Al_YAs$ active layer ($0<X<Y<1$); 7 an n-$Ga_{1-Y}Al_YAs$ clad layer; and 8 an n-GaAs gap layer forming a double hetero junction type multilayer crystalline layer for laser driving. Reference numeral 9 denotes a p-side electrode of Au—Zn; 10 an n-side electrode of Au—Ge—Ni; 11 a separating groove formed in parallel with the stripe groove 3 from the n-side electrode 10 to the GaAs substrate by an etching process; and 12 plastics to shield so that the laser beam is not irradiated to the outside of the chip. An element provided with the plastics is used as a dummy laser element 103. The dummy laser element 103 heats the element unit 101 in the light-off state of the laser element 102.

The first embodiment of the semiconductor laser system of the invention will now be described with reference to FIGS. 2 and 3. A semiconductor laser device 100 comprises: the element unit 101 (refer to FIG. 1) as a laser chip including a laser element 102 (refer to FIG. 1) and a dummy laser element 103 (refer to FIG. 1); and a pin photodiode 104 to detect a laser output amount of the laser element 102. Reference numeral 105 denotes a semiconductor laser driver to drive the semiconductor laser device 100; 106 a load resistance to set a laser current; 107 a load resistor to convert a current of the pin photodiode 104 into a voltage; and 108 a CPU as means for controlling a laser light amount. The CPU has therein: analog/digital conversion input port 109 (hereinafter, simply referred to as an A/D input port 109); a digital/analog conversion output port 110 (hereinafter, referred to as a D/A output port 110); an arithmetic operating unit 111 (hereinafter, referred to as an ALU 111); an ROM 112; an RAM 113; and the like.

The D/A output port 110 of the CPU 108 is connected to voltage terminals $V_{L1}$ and $V_{L2}$ to set a laser current of the semiconductor laser driver 105. By increasing output voltages $V_1$ and $V_2$ ($V_1$ is used for coarse adjustment, $V_2$ is used for fine adjustment) which are applied to the terminals $V_{L1}$ and $V_{L2}$, the laser current increases and the laser light amount increases. The laser light amount is converted into the current by the pin photodiode 104 and is, further, converted into the voltage by the load resistor 107. After that, the voltage is returned as an input voltage (signal name MO) to the A/D input port of the CPU 108. The CPU changes the output voltage of the D/A output port 110 so that the input voltage MO is equal to a set target value, thereby making a laser light amount constant.

As for the on/off means of the laser, as shown in FIG. 3, by setting a switching data input terminal /DATA of the semiconductor laser driver 105 to the low level (hereinafter, referred to as an L level), a current $I_{LD}$ is supplied to the laser element 102 side connected to a laser connecting terminal LD by a differential current switch 114 provided in the device, so that the laser element 102 emits the light. By setting the input terminal /DATA to the high level (hereinafter, referred to as an H level), a current is supplied to the dummy laser element 103 connected to a load resistor connecting terminal RO to set a laser current.

Figure 5:
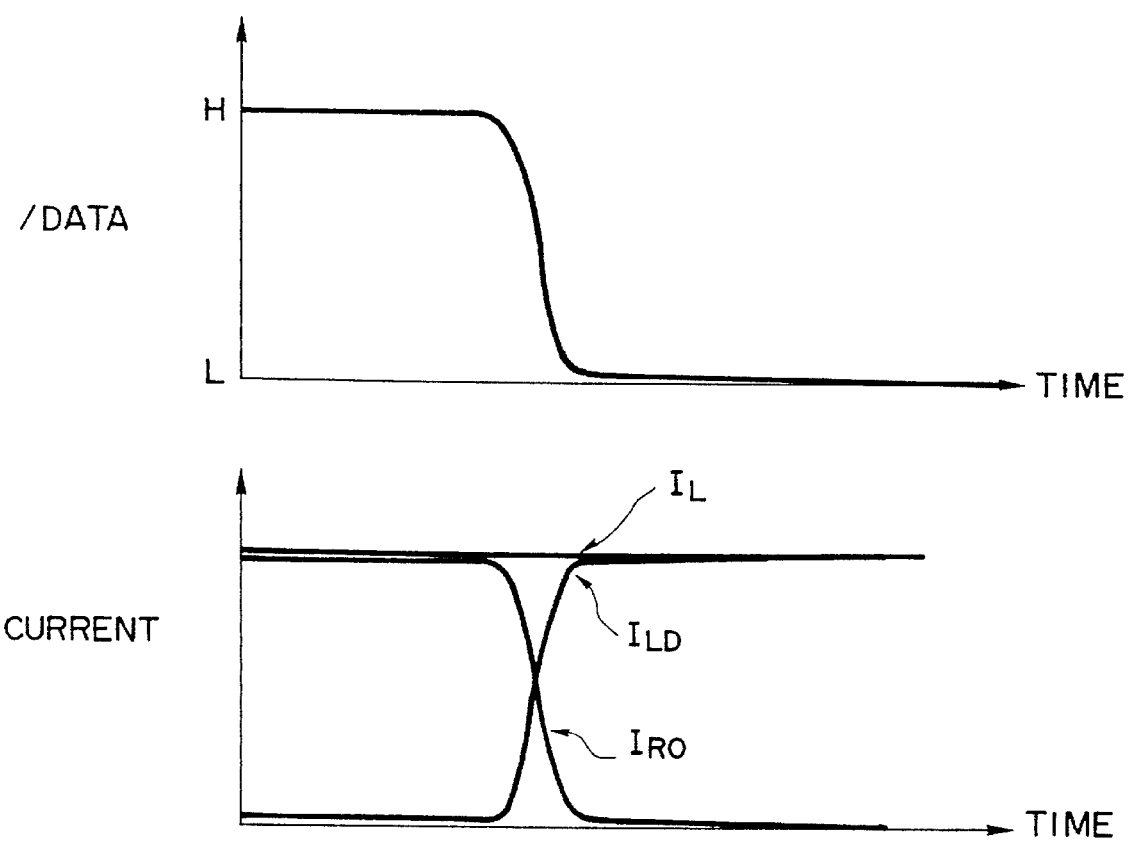
FIG. 5 is a timing chart showing the operation of a differential current switch in FIG. 3.

FIG. 5 is a timing chart for switching of the element unit 101. A total current $I_L$ of a current $I_{LD}$ flowing in the laser element 102 and a current $I_{RO}$ flowing in the dummy laser element 103 is always constant.

Figure 6:
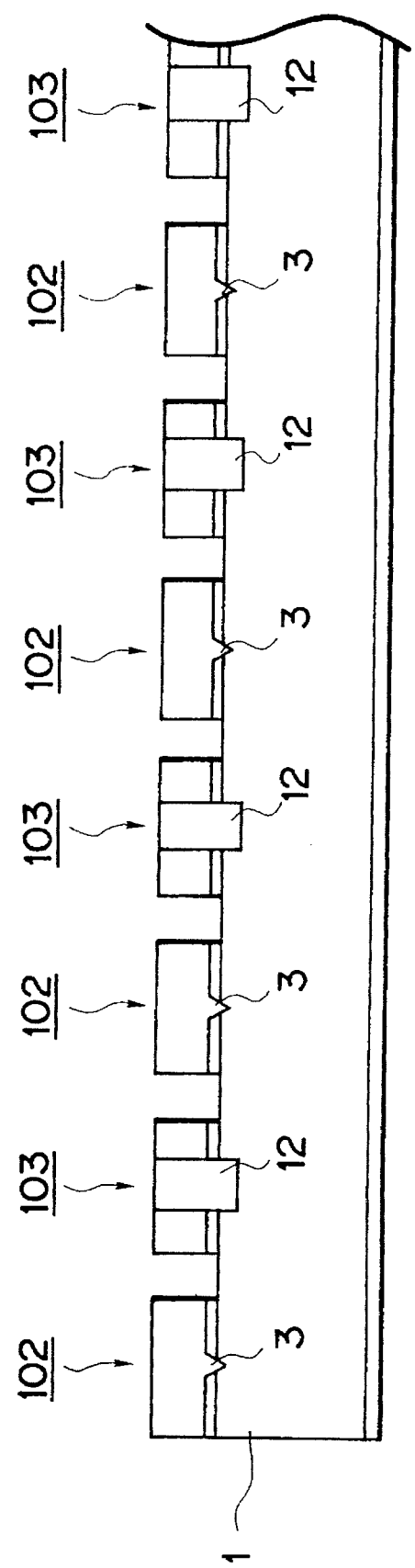
FIG. 6 is a constructional diagram showing a laser chip constructing a plurality of element units.

As mentioned above, at least one of a plurality of laser elements 102 and 103 formed on one chip is set to the dummy laser element 103 such that the laser beam does not go out of the element unit. In the light-off state (non-current supplying state) of the laser element 102, by supplying a current to the dummy laser element 103 which intends to consume an electric power, electric powers which are consumed as a heat on a chip unit basis in the light-on and light-off states of the laser element 102 are made constant. A temperature difference on the chip in the light-on and light-off states of the laser element 102 is reduced as much as possible. Due to this, a change in electric power which is consumed as a heat from the light-off time to the light-on time of the laser element 102 is small. It is possible to prevent the decrease in laser power at the time of light-on of the laser element 102. In the semiconductor laser device 100 used in the embodiment, only one laser element 102 and only one dummy laser element 103 on the chip of the element unit 101 have been shown. However, so long as the idea such that the temperature of the laser chip 101 is not changed from the light-off state to the light-on state is realized, a plurality of laser elements 102 and dummy laser elements 103 can be also used as shown in FIG. 6.

As described above, the semiconductor laser system of the invention comprises: the semiconductor laser device 100 in which the element unit 101 which is constructed by the laser element 102 and the dummy laser element 103 as a heating element to heat a chip is formed on one chip; and a control apparatus (105, 108) for driving the laser element 102 at the time of laser light-on and switching and driving the dummy laser element 103 in the laser light-off state, thereby keeping the chip to a constant temperature.

As described above, according to the semiconductor laser device 100 of the invention, a plurality of laser elements 102 and 103 are formed on one chip and the emitting port of at least one of the plurality of laser elements is covered by the shielding member so that the laser beam cannot be irradiated to the outside, thereby constructing as a dummy laser element 103.

Figure 7A:
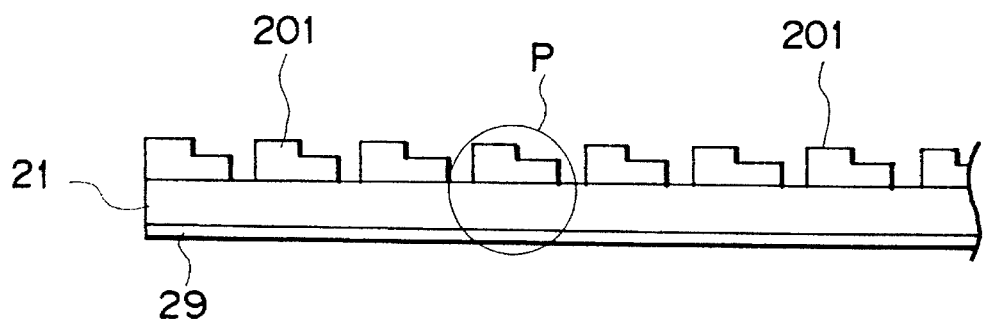
FIG. 7A is a diagram showing a semiconductor laser device which is used in the second embodiment of the invention and is a diagram showing a state in which a plurality of element units are formed.
Figure 7B:
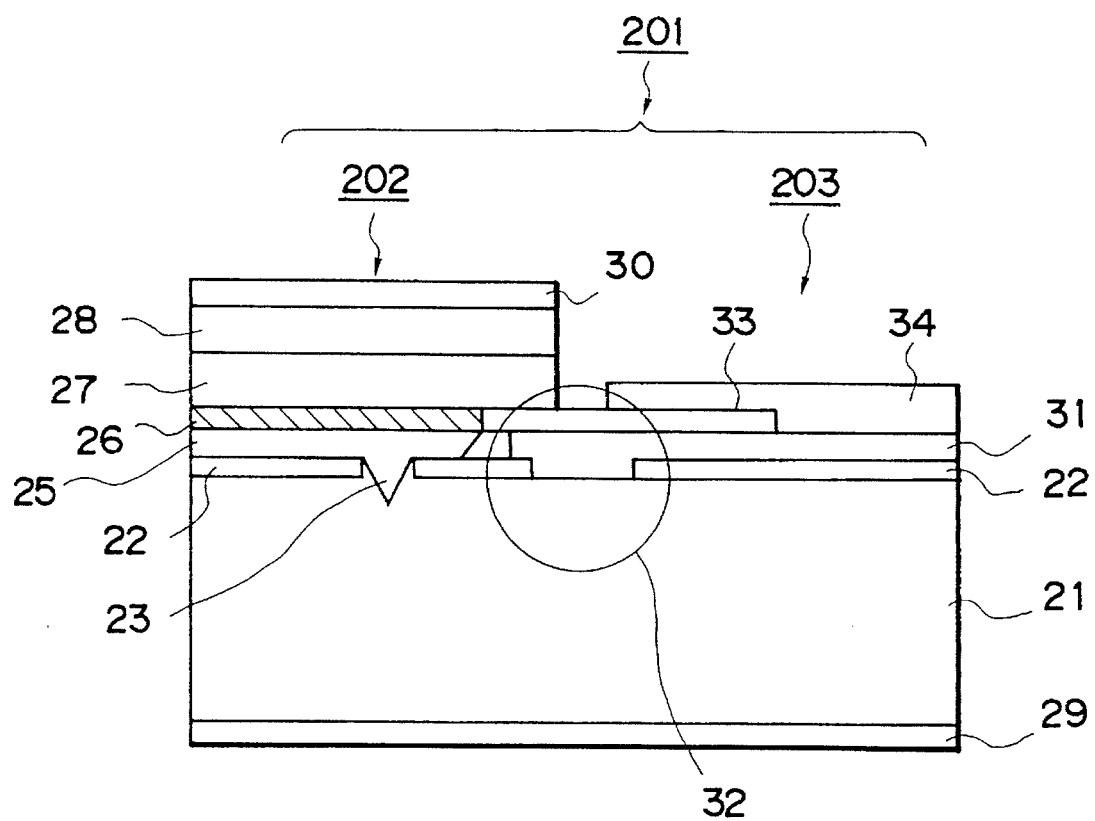
FIG. 7B is a constructional diagram showing one of the element units in FIG. 7A in detail.

The second embodiment of the invention will now be described with reference to FIGS. 7A to 9. A semiconductor laser device which is used in the semiconductor laser system of the embodiment is constructed by a plurality of element units 201 and a pin photodiode 204 formed on a substrate 21 as shown in FIG. 7A. FIG. 7B is an enlarged cross sectional view showing the element unit 201 indicated by a character "P" in FIG. 7A. The element unit 201 is a laser chip which is fundamentally based on an internal stripe structure semiconductor element ("Applied Physics Lett", Vol. 40, page 312, Mar. 1, 1982) in which an n-type current blocking layer is deposited onto the p-type substrate and a V-shaped groove is etched. In FIG. 7B, reference numeral 21 denotes a p-type GaAs substrate; 22 an n-GaAs current blocking layer; and 23 a stripe groove formed by a well-known photolithography technique. The current blocking layer 22 in the stripe groove 23 is eliminated and this portion becomes a current path. Reference numeral 25 denotes a P-$Ga_{1-Y}Al_YAs$ clad layer; 26 a $Ga_{1-Y}Al_XAs$ active layer ($0<X<Y<1$); 27 an n-$Ga_{1-Y}Al_YAs$ clad layer; and 28 an n-GaAs gap layer forming a multilayer crystalline layer for laser operation of the double hetero junction type. A laser layer is formed between the p-side electrode 29 of Au—Zn and the n-side electrode 30 on the laser side of Au—Ge—Ni.

On the other hand, reference numeral 31 denotes an $n^+$-type semiconductor layer and a diode PN junction is formed in a portion 32; 33 a current blocking layer to electrically isolate a laser layer (laser element) and a diode layer (diode element); and 34 a diode-side n-side electrode of Au.

Figure 8:
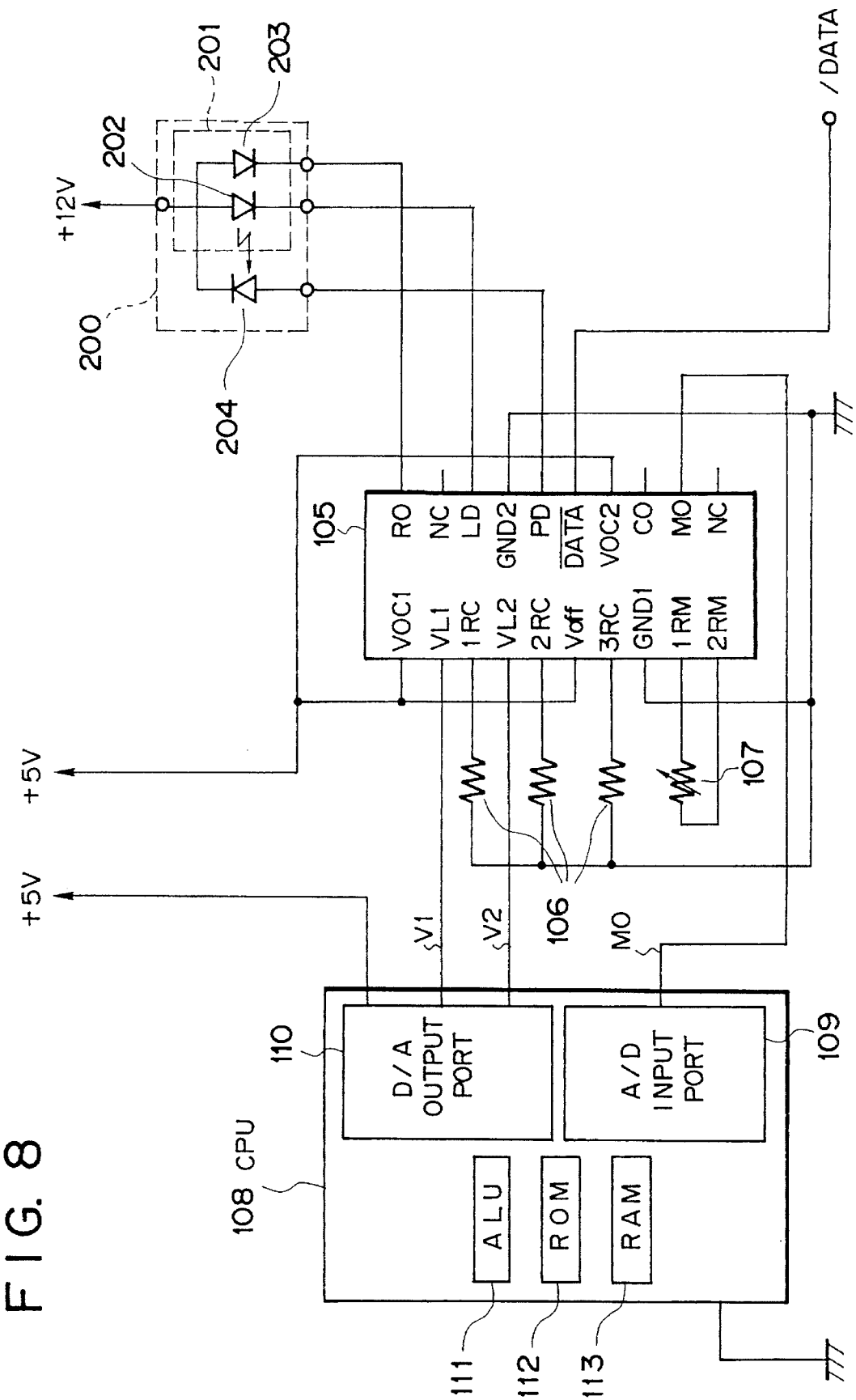
FIG. 8 is a block diagram showing the second embodiment of the invention and corresponds to the case of driving one of the element units in FIG. 7A.

A control circuit for one element unit 201 is constructed as shown in FIG. 8. Each element unit 201 of the semiconductor laser device 200 includes a laser element 202 and a diode element 203. The pin photodiode 104 detects a light emission amount of the laser element 202. Since the construction and operation of the other circuit portions are similar to those shown and described in FIG. 2, by replacing the dummy laser element 103 in FIG. 2 to the diode element 203 and considering, its operation will be easily understood. The construction of the semiconductor laser device 200 will be also easily understood by replacing the dummy laser element 103 in FIG. 4 to the diode element 203 and considering. Therefore, in the embodiment, when the laser element 202 is lit off (non-current supplying state), by supplying a current to the diode element 203, electric powers which are consumed on a chip unit basis in the light-on and light-off states of the laser element 202 can be made constant, a temperature difference on the chip in the light-on and light-off states of the laser element can be reduced as much as possible, and a change in light output by the heat which is generated in the laser light-on state can be reduced. In this case, the diode element 203 functions as a rectifying diode which doesn't emit a light.

Figure 9:
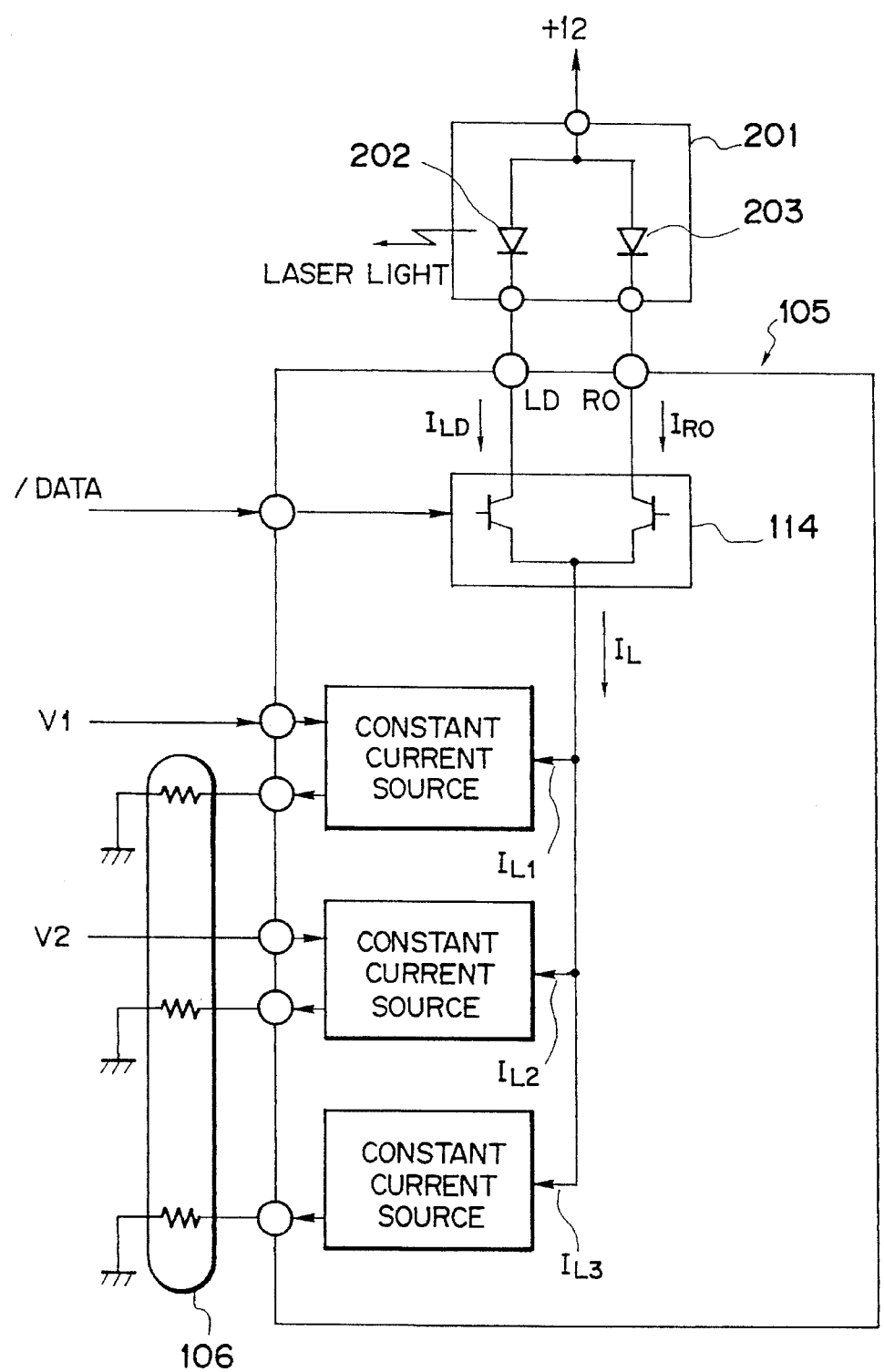
FIG. 9 is a block diagram showing the details of a semiconductor laser driver in FIG. 8.

FIG. 9 is a detailed block diagram of a semiconductor laser driver in FIG. 8. Since it can be easily understood by replacing the dummy laser element 103 in FIG. 3 to the diode element 203 and considering, its detailed description is omitted here.

A timing chart for the laser switching operation is similar to that shown in FIG. 5. The total current $I_L$ of the current $I_{LD}$ flowing in the laser element 202 and the current $I_{RO}$ flowing in the diode element 203 is always constant.

As mentioned above, according to the embodiment, the laser element 202 and the diode element 203 as a dummy of the laser element 202 are provided on the semiconductor laser device 201. In the light-off state (non-current supplying state) of the laser element 202, by supplying a current to the diode element 203, the electric powers which are consumed as a heat on a chip unit basis in the light-on and light-off states of the laser element 202 can be made constant. A temperature difference on the chip in the light-on and light-off states of the laser element 202 is reduced as much as possible. Thus, a change in electric power which is consumed as a heat from the light-off state to the light-on state decreases and a reduction of the laser output at the time of laser light-on can be prevented.

As mentioned above, according to the embodiment, the laser element 202 and the diode element 203 are formed on the same substrate 21 (same chip). In this case, when the diode element is connected to the power source to which the laser element is connected, the diode element generates a heat of almost the same amount as the amount of heat which is generated when the laser element emits the laser beam. In the light-off state of the laser element, the semiconductor driver 105 drives the diode element, thereby preventing that the laser output decreases at the time of laser light-on.

Figure 10:
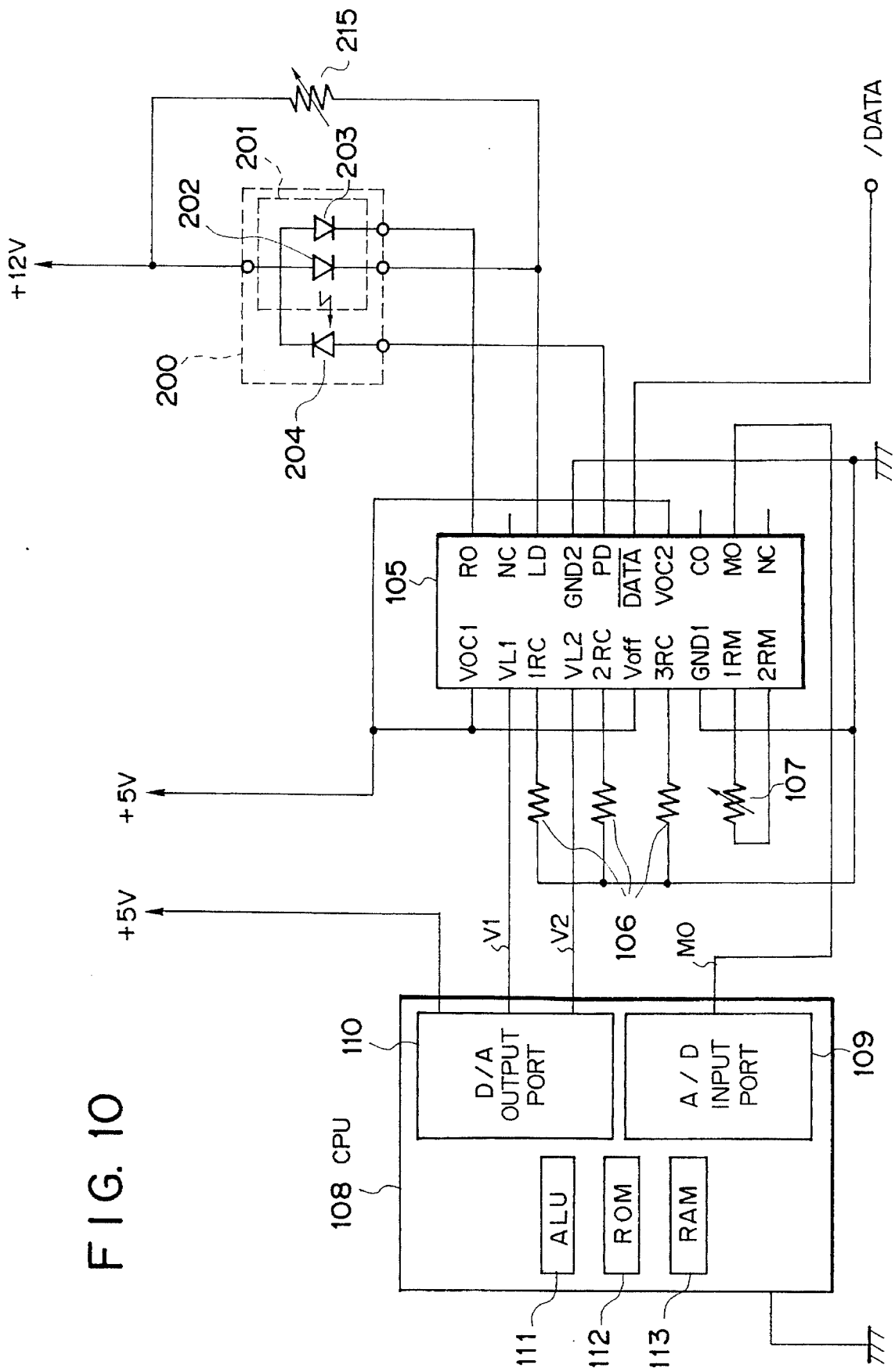
FIG. 10 is a block diagram showing the third embodiment of the invention.

The third embodiment of the invention will now be described with reference to FIG. 10. The embodiment of FIG. 10 is obtained by connecting a variable resistor 215 to the diode element 203 in the embodiment of FIG. 8 in parallel. Therefore, a current flowing in the diode element 203 changes in dependence on a resistance value of the variable resistor 215. It will be obviously understood that a fixed resistor can be also used in place of the variable resistor 215 so long as it will be known that it is sufficient to set the resistance value to a predetermined value. According to the variable resistor 215, when a current of the same amount is supplied to the laser element 202 and diode element 203, the electric power which is consumed in the diode element 203 is larger than the electric power which is consumed on the laser element 202 side. In the case where the chip is excessively heated at the time of light-off state of the laser element 102, by setting the resistance value of the variable resistor 215 to a small value, the current flowing in the diode element 203 is reduced and the electric power consumptions of the elements can be made coincident. In this case, the resistance value of the variable resistor 215 can be obtained by the following equations.

$W_L = V_L \times I_L$ $W_D = V_D \times I_D$ $I_L = I_D \times I_R$ $V_D = I_R \times R$ $W_L$: electric power which is consumed by the laser element 202

$W_D$: electric power which is consumed by the diode element 203

$V_L$: forward direction voltage of the laser element 202

$V_D$: forward direction voltage of the diode element 203

$I_L$: laser current which is necessary to obtain a target light amount $I_D$: current flowing in the diode element 203 at the time of laser light-off $I_R$: current flowing in the resistor 215 at the time of laser light-off R: resistance value of the resistor 215

Now, assuming that $W_D = W_L$, $R = V_D^2/(V_D - V_L)/I_L$ (in case of $V_D > V_L$)

The fourth embodiment of the invention will now be described with reference to FIG. 11. In the embodiment, different from the embodiment of FIG. 10, the variable resistor 215 is connected to the laser element 202 in parallel instead of the diode element 203. Therefore, as for the variable resistor 215, when a current of the same amount is supplied to the laser element 202 and diode element 203, the electric power which is consumed by the diode element 203 is smaller than the electric power which is consumed on the laser element 202 side. In the case where the chip cannot be completely heated at the time of light-off of the laser element 102, by setting the resistance value of the variable resistor 215 to a small value, the current flowing in the laser element 202 is reduced and the electric powers to be consumed can be made coincident. The resistance value of the variable resistor 215 is obtained by the following equations.

$W_L = V_L \times I_L$ $W_D = V_D \times I_D$ $I_D = I_L \times I_D$ $V_L = I_R \times R$ $W_L$: electric power which is consumed by the laser element 202

$W_D$: electric power which is consumed by the diode element 203

$V_L$: forward direction voltage of the laser element 202

$V_D$: forward direction voltage of the diode element 203

$I_L$: laser current which is necessary to obtain a target light amount $I_D$: current flowing in the diode element 203 at the time of laser light-off $I_R$: current flowing in the resistor 215 at the time of laser light-off R: resistance value of the resistor 215

Now, assuming that $W_D = W_L$, $R = V_D \times V_L/(V_L - V_D)/I_L$ (in case of $V_L > V_D$)

Figure 11:
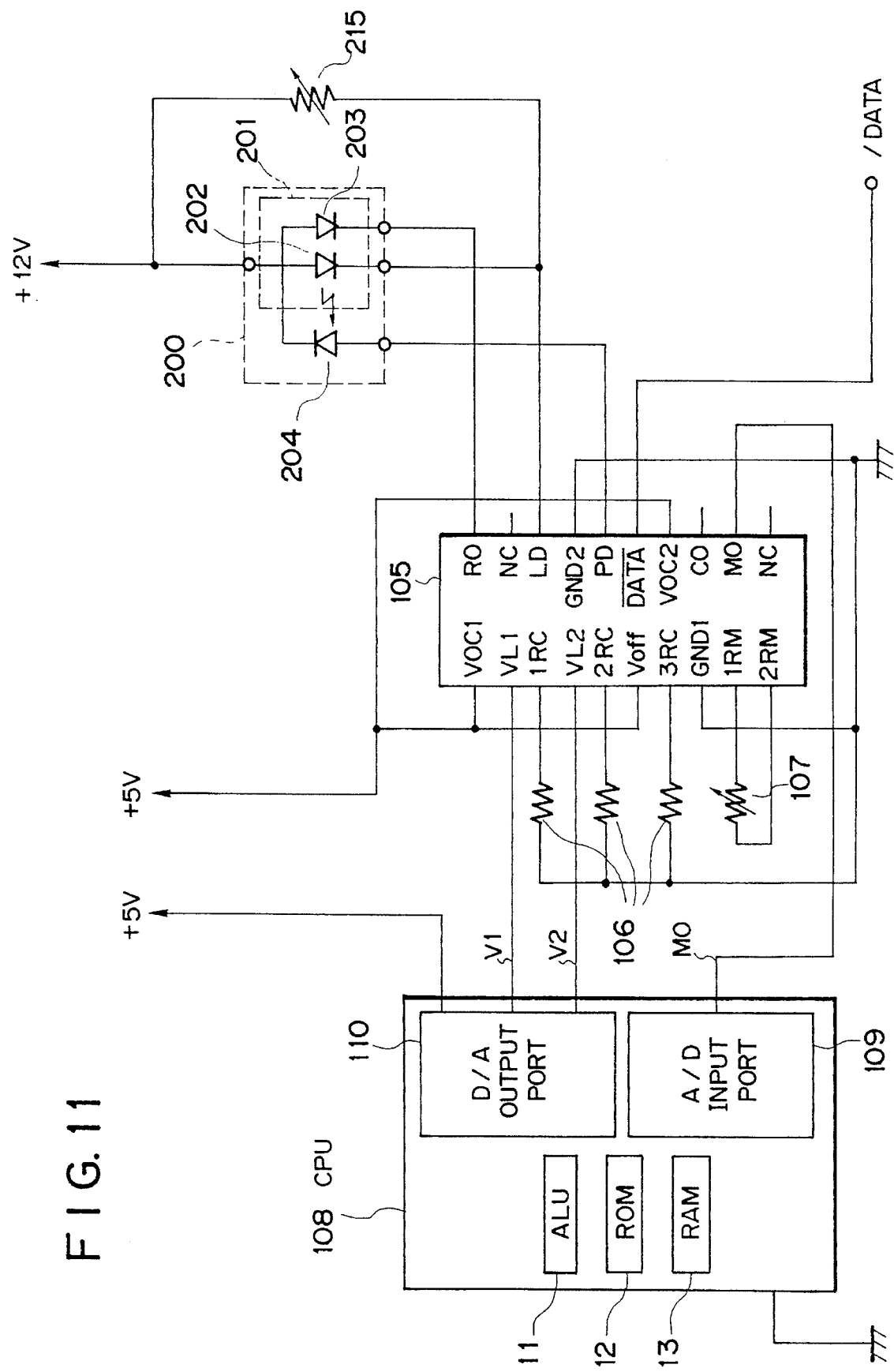
FIG. 11 is a block diagram showing the fourth embodiment of the invention.

It will be understood that the contents of the embodiments in FIGS. 10 and 11 can be also applied to the embodiment shown in FIG. 2. That is, it is sufficient to connect a variable resistor or fixed resistor in parallel to the dummy laser element 103 as a heating element or a laser element 102.

As described above, according to the invention, in a semiconductor laser system using a semiconductor laser device in which a laser element to emit a laser beam and a heating element to heat the chip are formed on one chip, in a light-off state (non-current supplying state) of the laser element, the control apparatus of the semiconductor laser system switches from the laser element to the heating element which intends to consume an electric power and supplies a current to the heating element. Due to this, a change in electric power consumption on a chip unit basis in the light-on and light-off states of the laser element is reduced, thereby reducing a temperature difference on the chip in the light-on and light-off states of the laser element and preventing the occurrence of a surplus electric power consumption at the time of light-on of the laser element. There if consequently an effect such that a decrease in laser beam power at the time of light-on can be reduced. On the other hand, when the control apparatus has a resistor to bypass a current which is supplied to the heating element or laser element, an amount of heat which is generated by the heating element or laser element can be freely adjusted. A decrease in laser beam output at the time of light-on can be also reduced.

Figure 13:
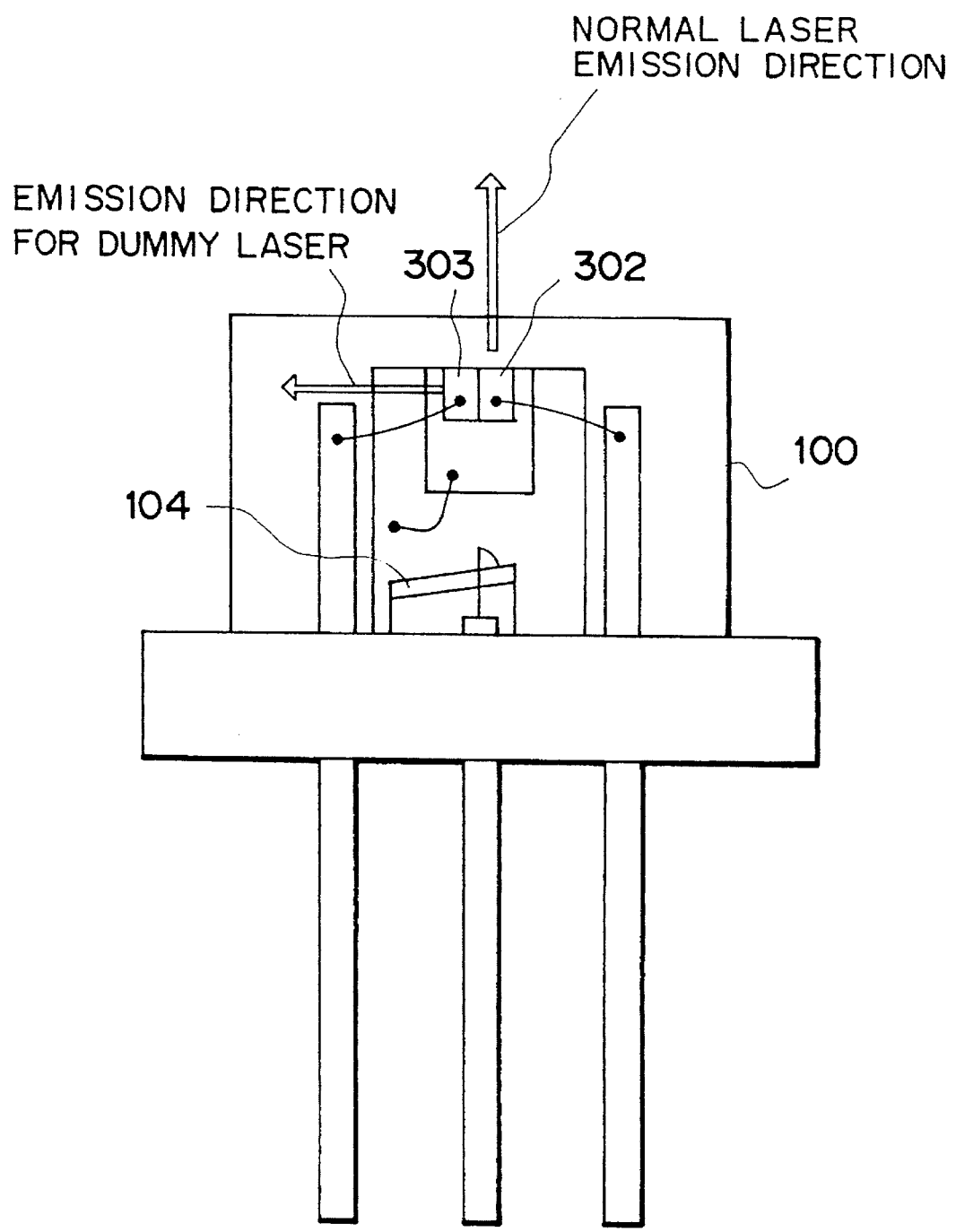
FIG. 13 is a diagram showing a construction of a semiconductor laser device using a laser chip of the embodiment of FIG. 12.

The fifth embodiment of the invention will now be described with reference to FIG. 12. Reference numerals 3 and 40 denote stripe grooves formed by a well-known photolithography technique. The current blocking layer 2 in each of the stripe grooves 3 and 40 is eliminated and this portion is used as a current path. Since the construction of other element units 301 is similar to that of the element units 101 shown in FIG. 1, its description is omitted. FIG. 13 is a diagram showing a construction of the semiconductor laser device using a laser chip of the embodiment of FIG. 12.

The laser chip, other construction, control means, and the like in the fifth embodiment are substantially the same as those in the first embodiment and their descriptions are omitted. As mentioned above, the stripe groove 40 on the dummy laser element 303 side is provided in the direction which is obtained by rotating the direction of the stripe groove 3 on a laser element 302 side which is actually used by 90°, thereby preventing that the laser beam emitted from a dummy laser element 303 is irradiated in the normal direction. In the light-off state (non-current supplying state) of the laser element, by supplying a current to the dummy laser element which intends to consume an electric power, the electric powers which are consumed on a chip unit basis in the light-on and light-off states of the laser element are made constant, thereby reducing a temperature difference of the chip in the light-on and light-off states of the laser element is reduced. A decrease in laser beam power by the heat which is generated at the time of light-on of the laser element is reduced. As mentioned above, the optical axis direction of the dummy laser element 303 is set to the direction which is deviated from the optical axis direction of the laser element 302.

Since the drive control system of the element unit 301 in the embodiment is similar to that of the element unit 101 shown in FIG. 1, its description is omitted here.

As described above, according to the invention, at least one of a plurality of laser elements formed on one chip is set to the dummy laser element in which the laser beam is not emitted in the normal laser emission direction of the laser element. In the light-off state (non-current supplying state) of the laser element, a current is supplied to the dummy laser element which intends to consume the electric power. Due to this, a change in electric powers which are consumed on a chip unit basis in the light-on and light-off states of the laser element is reduced. There are, consequently, effects such that a temperature difference on the chip in the light-on and light-off states of the laser element is reduced and a decrease in laser beam power at the time of light-on can be reduced.

Figure 14:
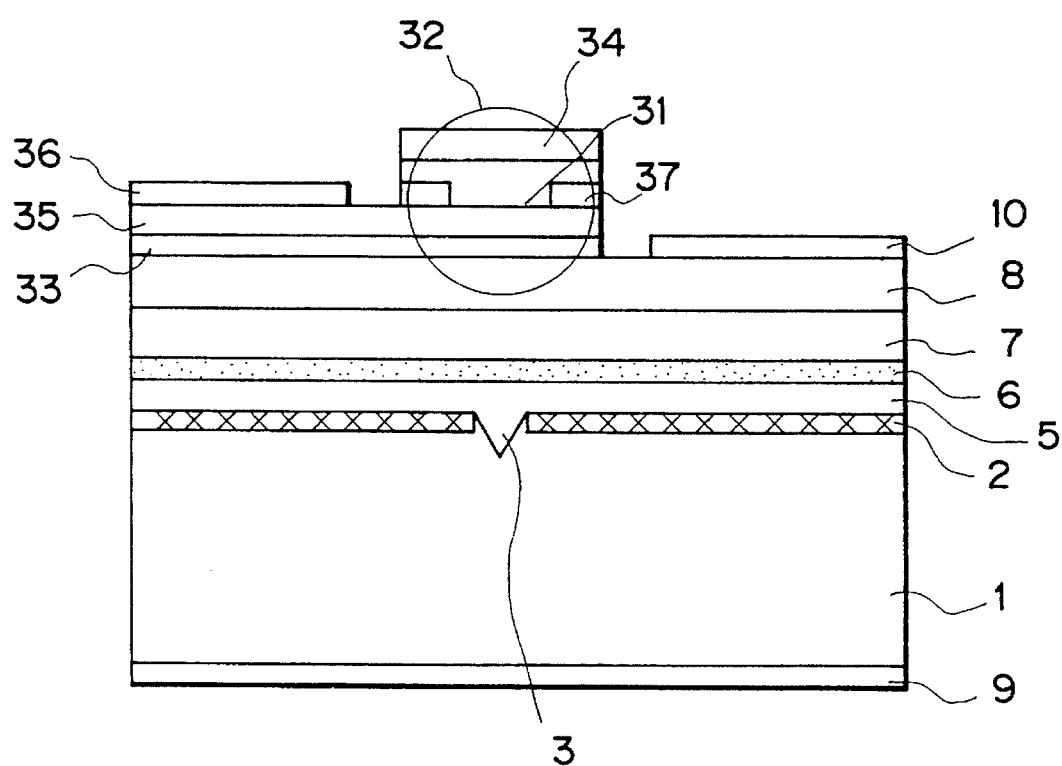
FIG. 14 is a diagram showing a structure of a semiconductor chip of the sixth embodiment.

The sixth embodiment of the invention will now be described with reference to FIG. 14. According to the embodiment, a diode layer is further formed on a laser layer which is fundamentally based on an internal stripe structure semiconductor element ("Applied Physics Lett", Vol. 40, page 312, Mar. 1, 1982) in which an n-type current blocking layer is deposited on the p-type substrate and a V-shaped groove is etched. In FIG. 14, reference numeral 33 denotes a current blocking layer to electrically isolate the laser layer and the diode layer formed thereon; 35 a p-type semiconductor layer; 31 the n⁺-type semiconductor layer in which a diode PN junction is formed in the portion of 32; 34 a diode-side n-side electrode of Au; and 36 a diode-side p-side electrode of Al. The laser-side p-side electrode 9 and the diode-side p-side electrode 36 are connected by bonding in the semiconductor laser element. Reference numeral 37 denotes a current blocking layer.

Since another construction, control method, and the like of the semiconductor laser device of the sixth embodiment are substantially the same as those in the second embodiment, their descriptions are omitted here.

According to the embodiment as mentioned above, the diode element is provided together with the laser element onto the chip of the semiconductor laser device. In the light-off state (non-current supplying state) of the laser element, by supplying a current to the diode element, the electric powers which are consumed on a chip unit basis in the light-on and light-off states of the laser element are made constant. A temperature difference on the chip in the light-on and light-off states of the laser element is extremely reduced, and a change in laser beam power due to the heat which is generated at the time of light-on of the laser is reduced.

Further another embodiment of the invention will now be described hereinbelow with reference to the drawings.

Figure 15:
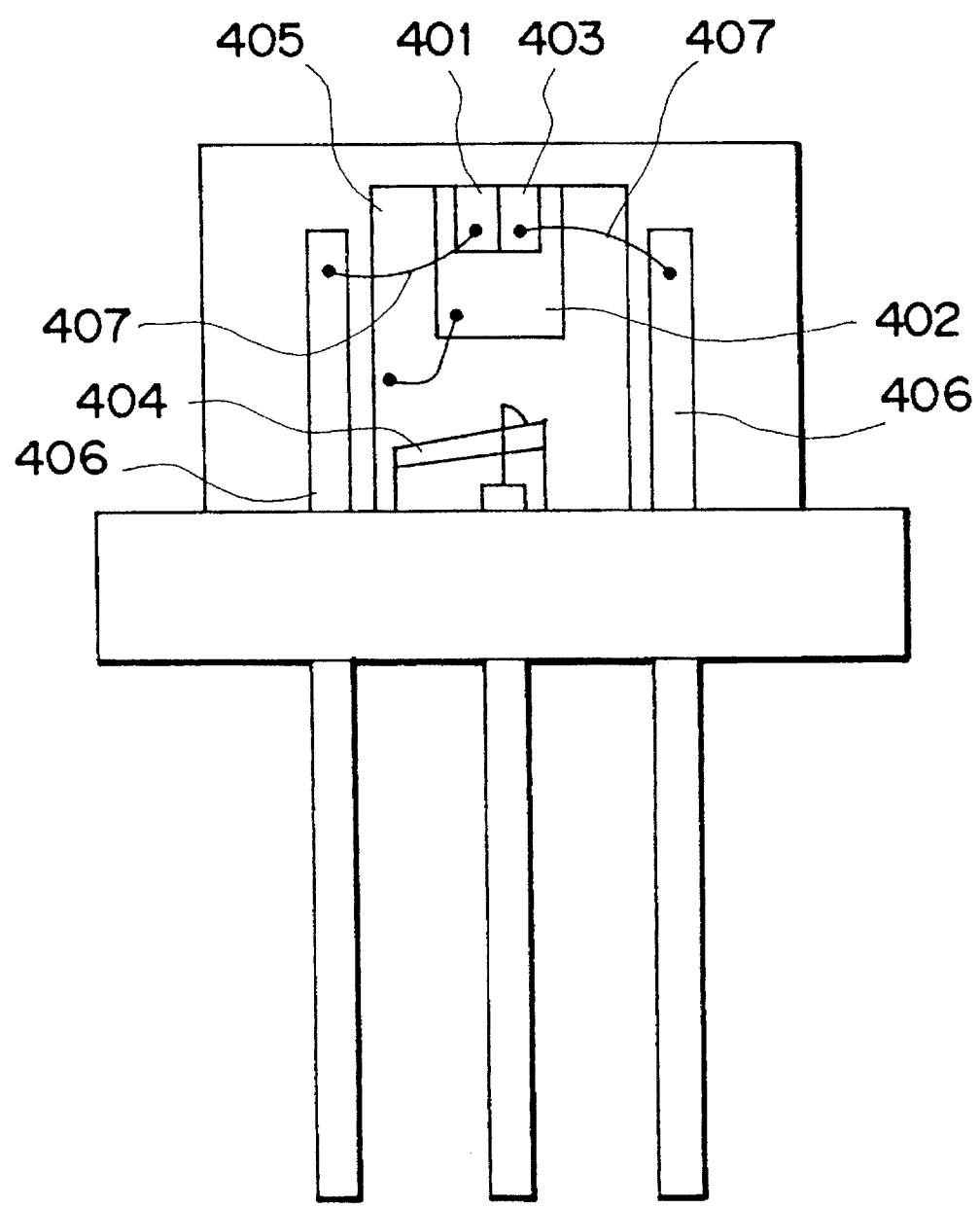
FIG. 15 is a diagram showing a construction of the seventh embodiment.

FIG. 15 is a constructional diagram of a semiconductor laser device of the seventh embodiment of the invention. In FIG. 15, reference numeral 401 denotes a laser chip; 402 a submount; 403 a resistor having characteristics such that it generates a heat by supplying a current to the resistor; 404 a pin photodiode to detect a light amount of the laser beam emitted from the laser chip 401; 405 a stem to support the laser chip 401, submount 402, and resistor 403; 406 a lead terminal; and 407 a bonding wire. The resistor 403 is attached to the submount 402 which is common to the laser chip 401. The resistor 403 is thermally coupled with the laser chip 401.

A resistance value ($R_H$) of the resistor 403 is set to a value which is calculated by the following equation (1). This is because the heat generation amounts when the current is supplied to the laser chip 401 and when the current is supplied to the resistor 403 are equalized, thereby equalizing the electric powers which are consumed in the laser light-on and light-off states.

$R_H = V_F/I_F$ ... (1)

$R_H$: resistance value of the resistor $I_F$: average laser forward current which is used $V_F$: average laser forward voltage which is used A control method of the semiconductor laser will now be described with reference to FIG. 16. Reference numeral 400 denotes a semiconductor laser device having therein the laser chip 401, resistor 403, and pin photodiode 404. Reference numeral 105 denotes the semiconductor laser driver; 106 the load resistor to set a laser current; 107 the load resistor to convert the current of the pin photodiode 404 into the voltage; and 108 the CPU as means for controlling the laser light amount. The CPU has therein: the analog/digital (A/D) conversion input port 109; digital/analog (D/A) conversion output port 110; arithmetic logic unit (ALU) 111; RAM 113 and ROM 112 as memory means; and the like.

The D/A conversion output port 110 of the CPU 108 is connected to a voltage terminal to set the laser current of the semiconductor laser driver 105 ($V_1$ is used for coarse adjustment, $V_2$ is used for fine adjustment). By raising the output voltage, the laser current increases and the laser beam amount increases. The laser beam amount is detected by the pin photodiode 404 and is current/voltage converted. After that, the voltage signal is supplied to the A/D conversion input port of the CPU 108 (signal name MO). The laser beam amount is made constant by changing the output value of the D/A conversion output port by the CPU so that the input voltage (MO) is equalized to the set value.

Figure 17:
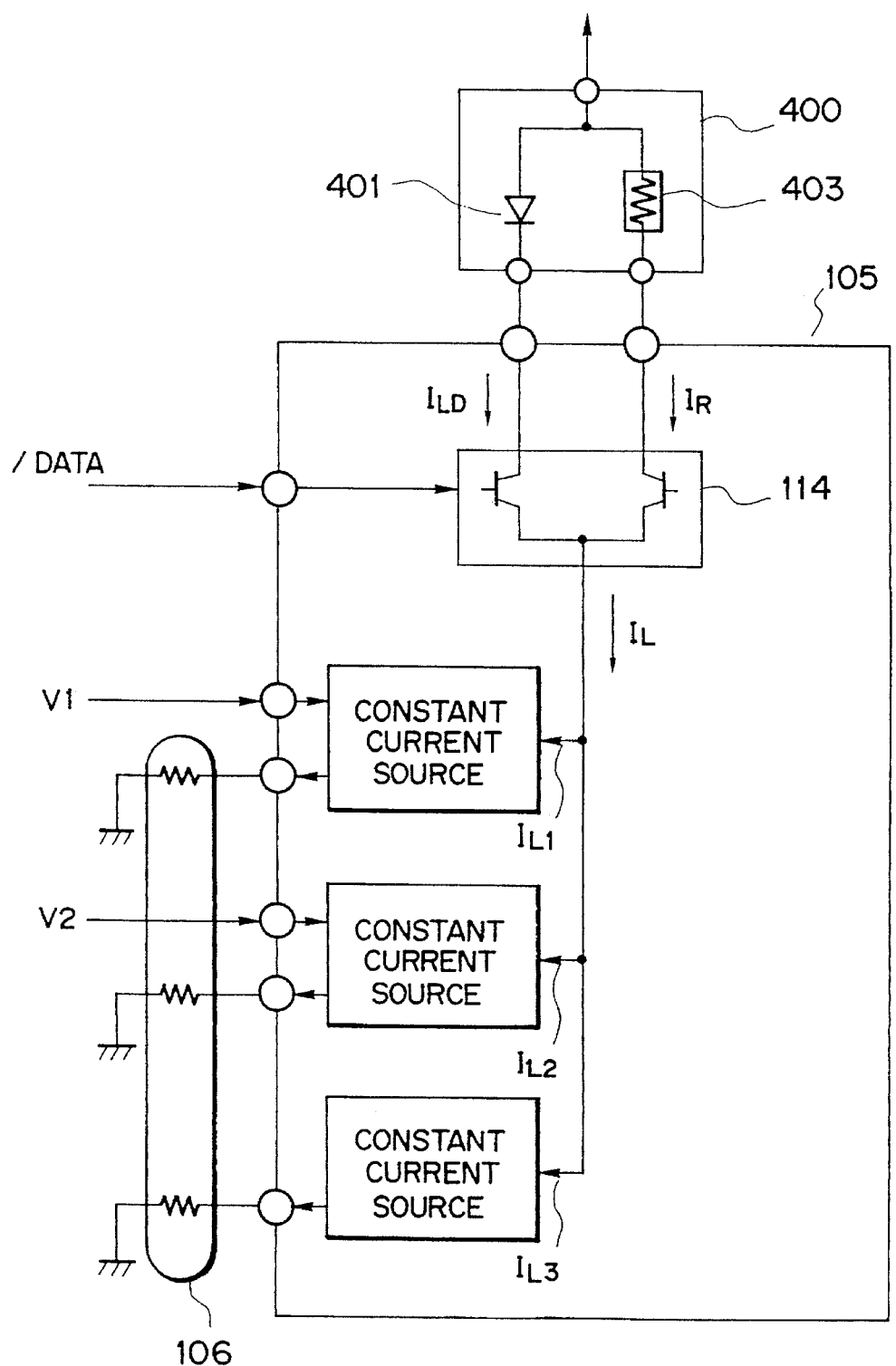
FIG. 17 is a circuit diagram showing a current switching of the seventh embodiment.

As shown in FIG. 17 as well, by setting the switching data input terminal (/DATA) of the semiconductor laser driver 105 to the low level, a current ($I_{LD}$) is supplied to the laser chip 401 side connected to the laser connecting terminal by an internal differential current switch 114, so that a laser beam is generated. By setting the terminal /DATA to the high level, a current ($I_R$) is supplied to the resistor 403 side in the semiconductor laser device 400 connected to the load resistor connecting terminal for laser current, so that the resistor 403 generates a heat.

Figure 18:
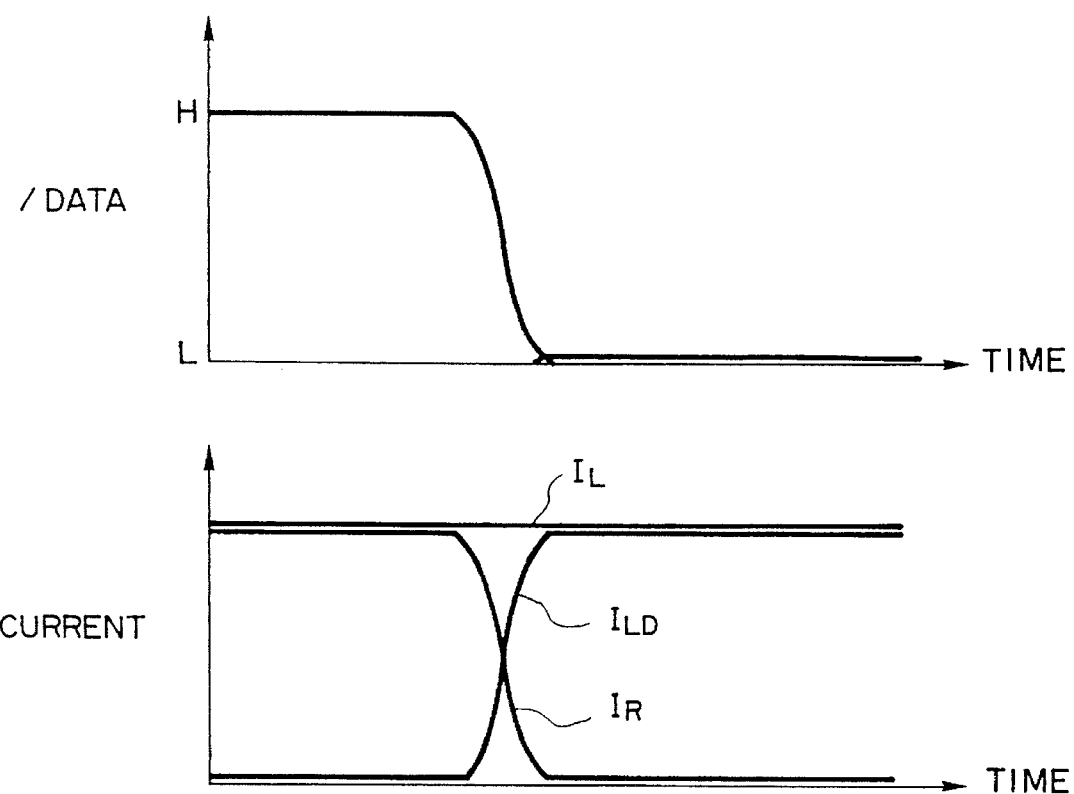
FIG. 18 is a diagram showing a timechart of the current switching in the seventh embodiment.

As shown in a timechart (FIG. 18) of the control, the total current ($I_L$) of the current ($I_{LD}$) which is supplied to the laser chip 401 side and the current ($L_R$) which is supplied to the resistor 403 side is always constant.

Even in the laser light-off state as well, by applying a heat of almost the same amount as that in the light-on state into the semiconductor laser device 400 through the heat generation resistor 403, a temperature difference on the chip in the laser light-on and light-off states can be reduced as much as possible and a change in laser beam power due to the heat which is generated in the laser light-on time can be reduced.

Figure 19:
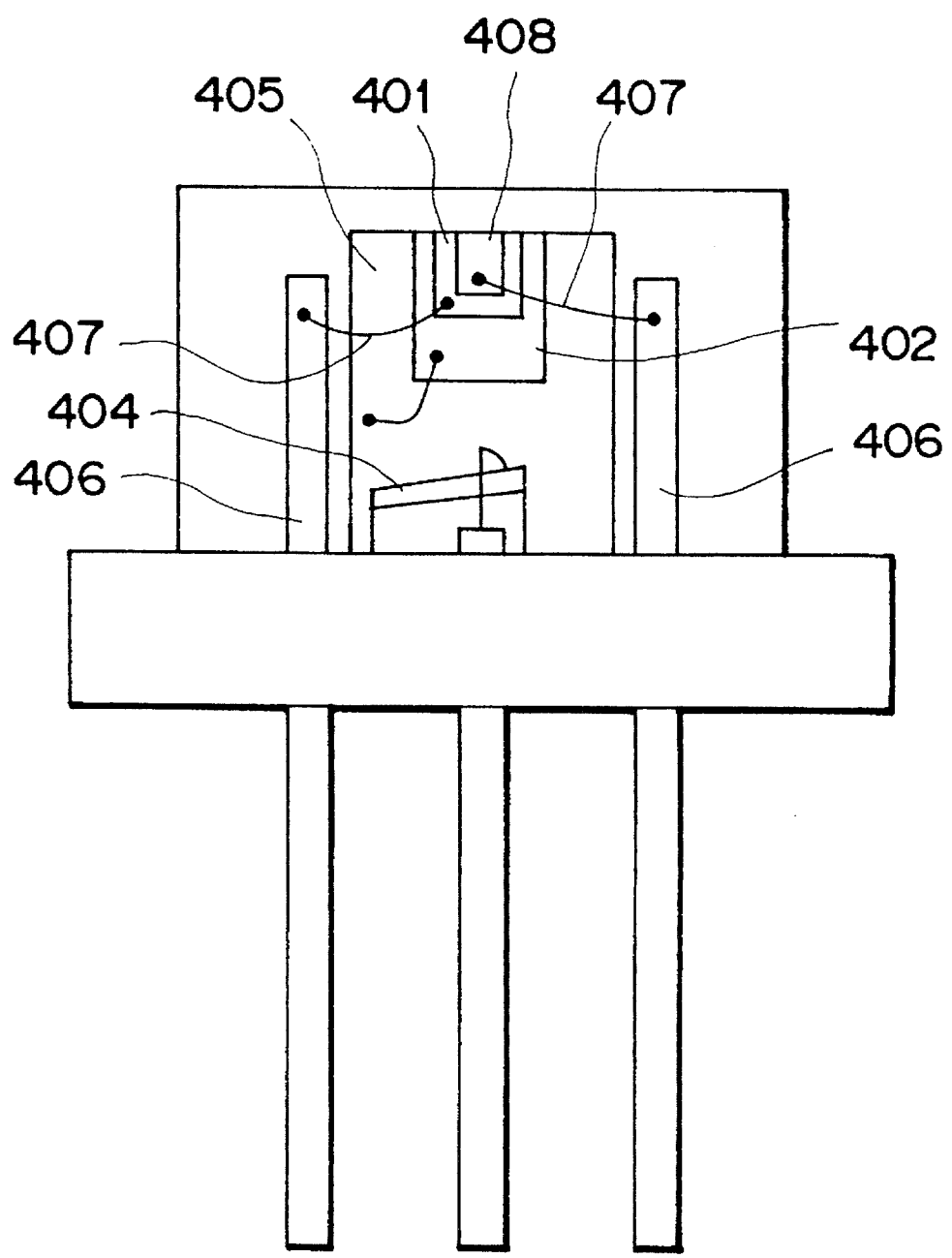
FIG. 19 is a diagram showing a construction of the eighth embodiment.

A semiconductor laser device of the eighth embodiment of the invention will now be described hereinbelow. FIG. 19 is a constructional diagram of the eighth embodiment. The eighth embodiment has a feature with respect to a point that a resistor 408 is provided on the laser chip 401. The other portions are similar to those in the seventh embodiment. With such a construction, the heat can be more efficiently transferred from the resistor 408 to the laser chip 401. The temperature difference between the laser light-on and light-off states is reduced. A change in laser beam power due to the heat generated at the time of the turn-on of the laser can be reduced.

Figure 20:
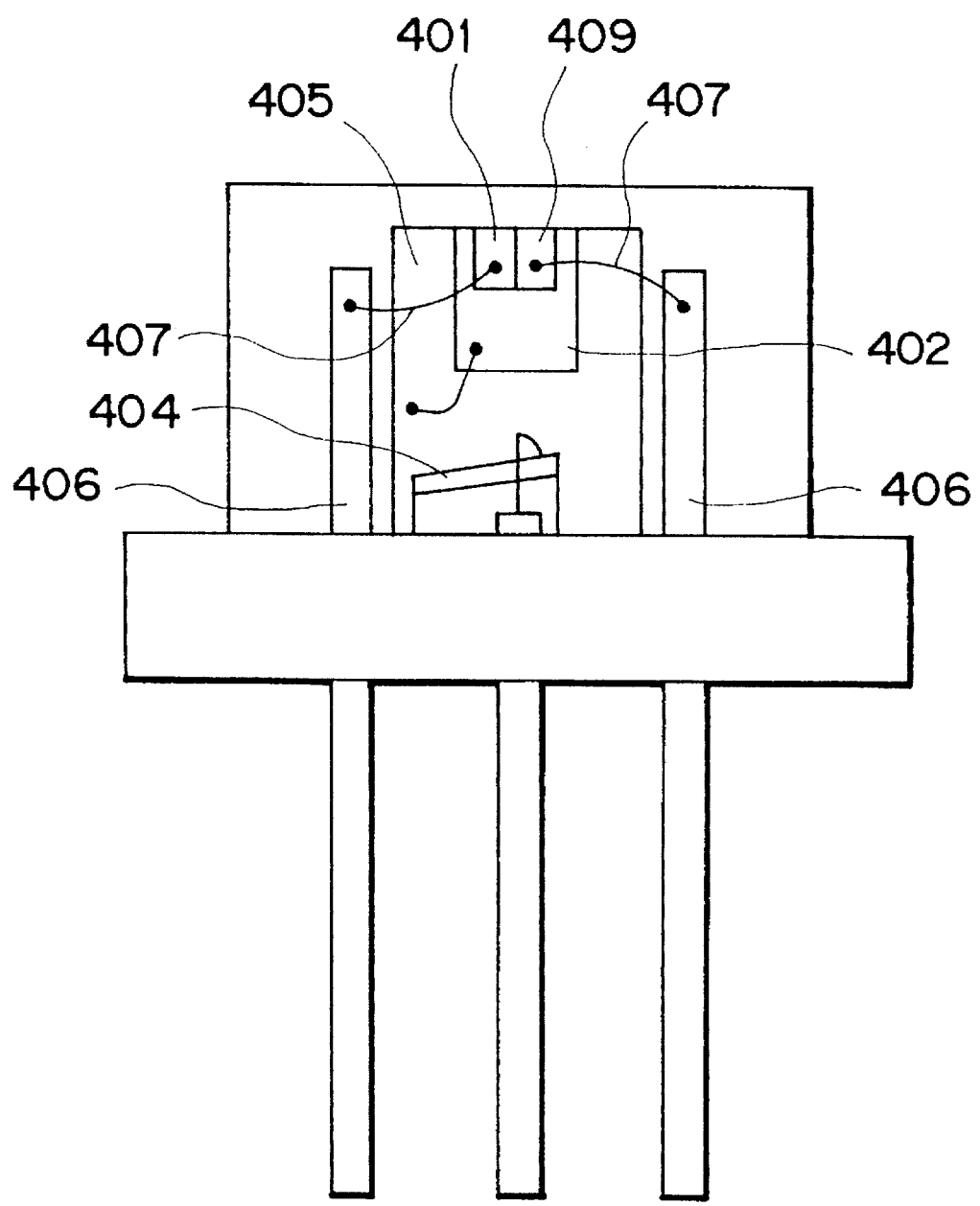
FIG. 20 is a diagram showing a construction of the ninth embodiment.

FIG. 20 is a constructional diagram of a semiconductor laser device of the ninth embodiment of the invention and is characterized in that a diode 409 as heat generating means which is thermally coupled to the laser chip 401 by the submount 402 is provided. The other construction is similar to the seventh embodiment.

Forward-current/forward-voltage characteristics of the diode 409 and the laser 401 are equalized and the electric powers which are consumed when the current is supplied to the laser chip 401 and when the current is supplied to the diode 409 are equalized, thereby equalizing the heat generation amounts in the laser light-on and light-off states.

Figure 16:
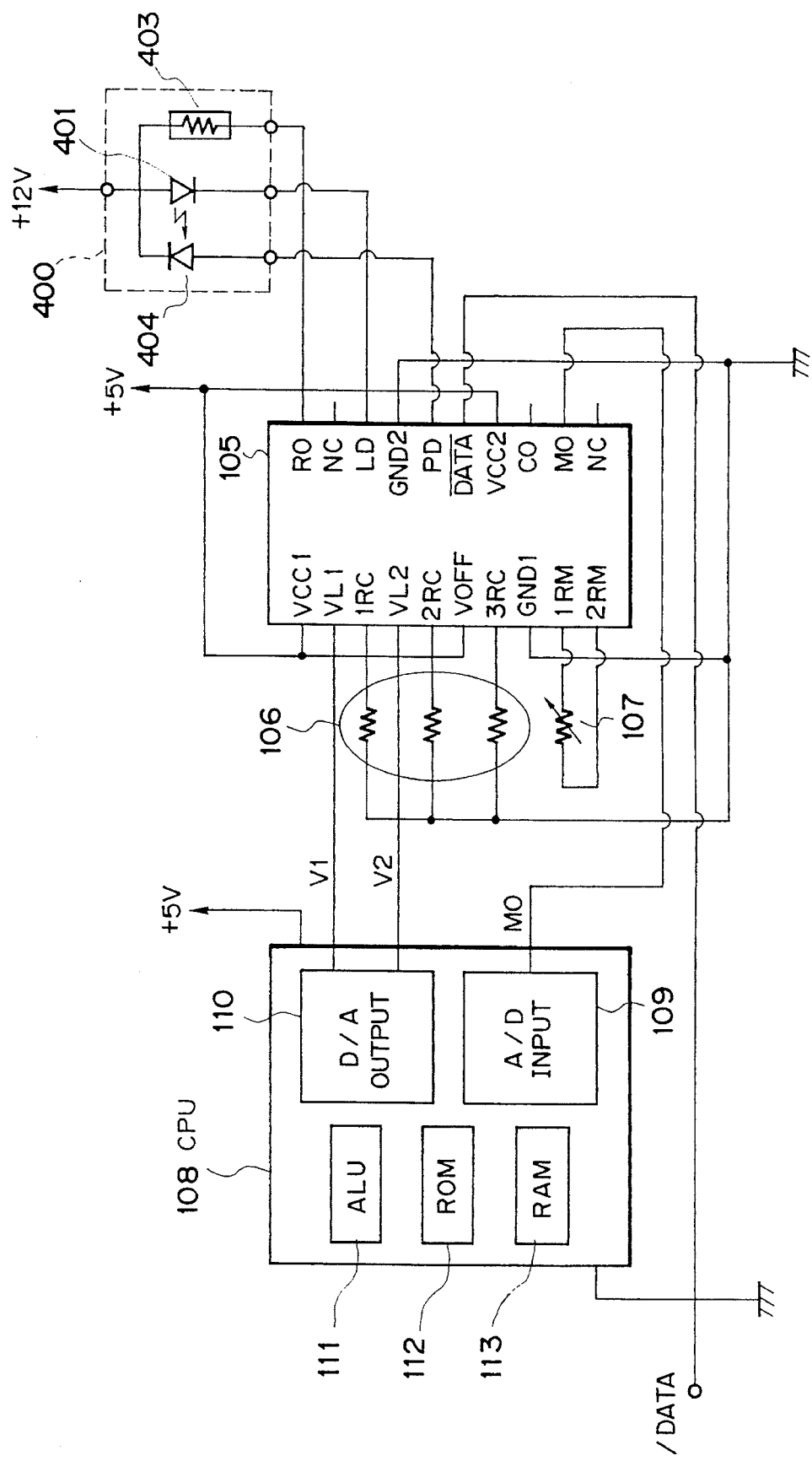
FIG. 16 is a circuit diagram showing a control of the seventh embodiment.
Figure 21:
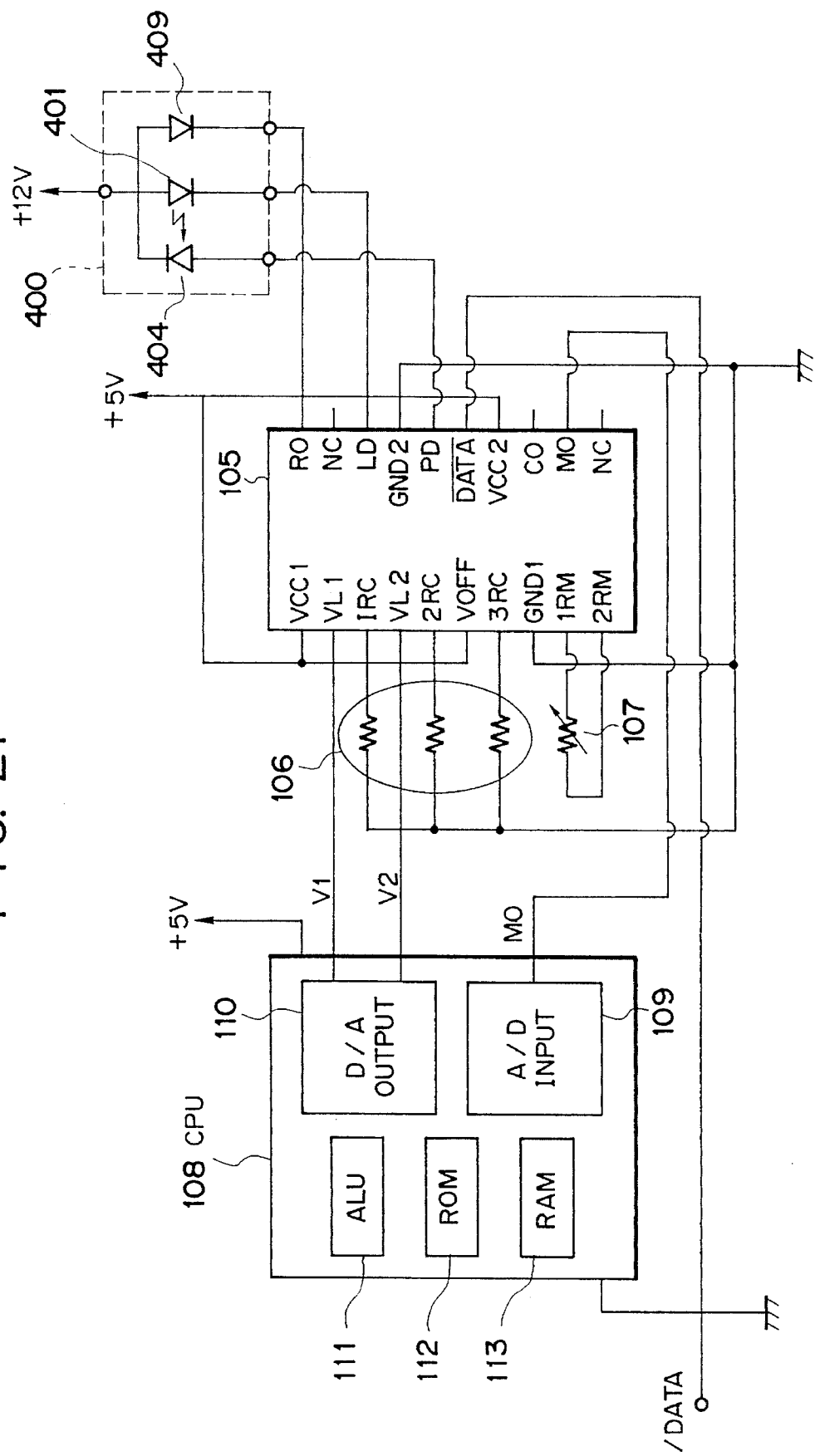
FIG. 21 is a circuit diagram showing the control of the ninth embodiment.

A control method of the semiconductor laser device is as shown in FIG. 21 and is similar to that shown in FIG. 16 except that the diode 409 is provided in place of the resistor 403.

Figure 22:
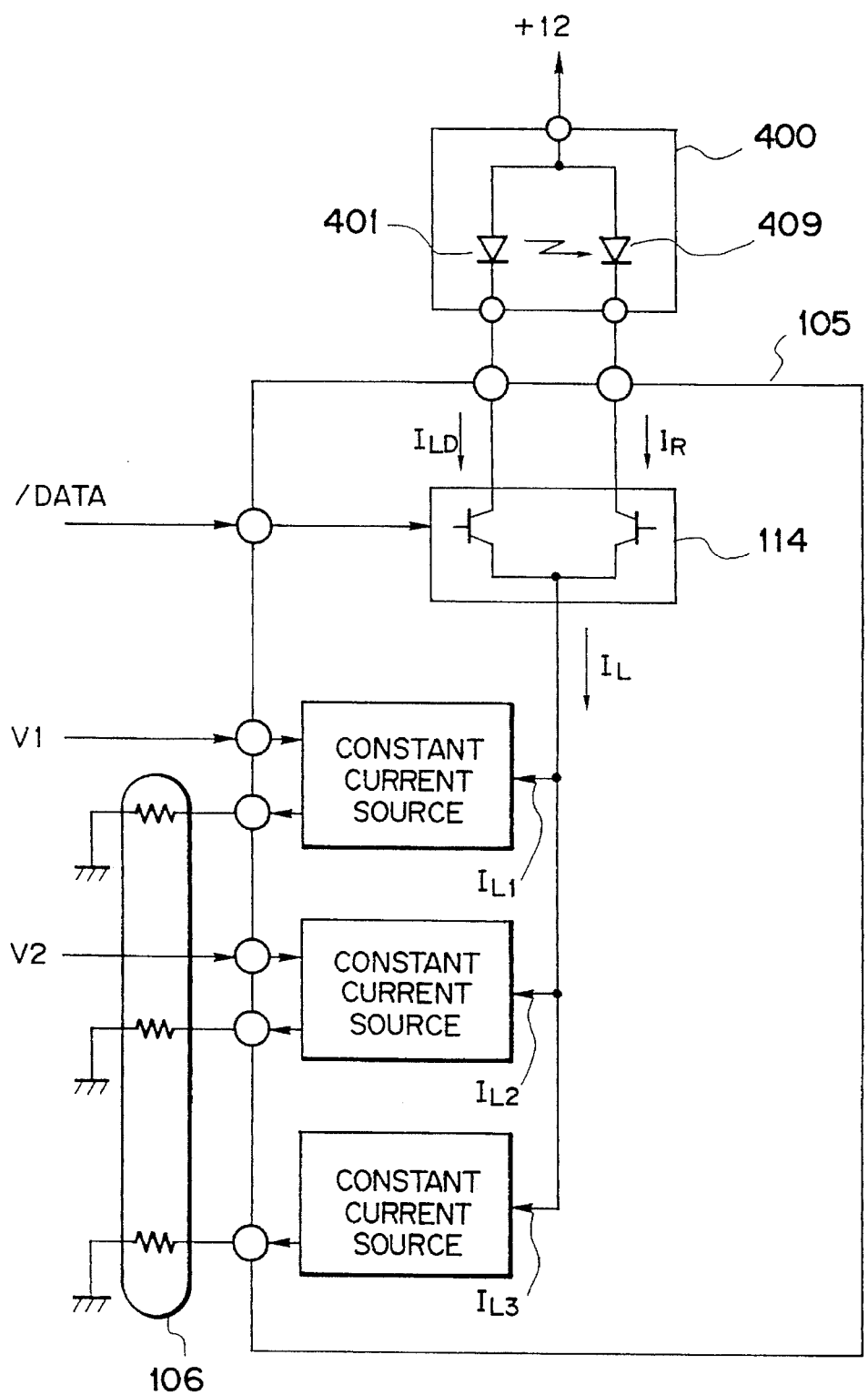
FIG. 22 is a circuit diagram showing a current switching of the ninth embodiment.

As shown in FIG. 22 as well, by setting the switching data input terminal (/DATA) of the semiconductor laser driver 105 to the low level, the current ($I_{LD}$) flows to the laser chip 401 side connected to the laser connecting terminal by the differential current switch 114 provided in the device, so that the laser emits a laser beam. By setting the input terminal /DATA to the high level, the current ($I_D$) flows to the diode 409 side in the semiconductor laser 400 connected to the load resistor connecting terminal to set a laser current. An electric power is consumed by the diode 409 and the diode 409 generates a heat.

Figure 23:
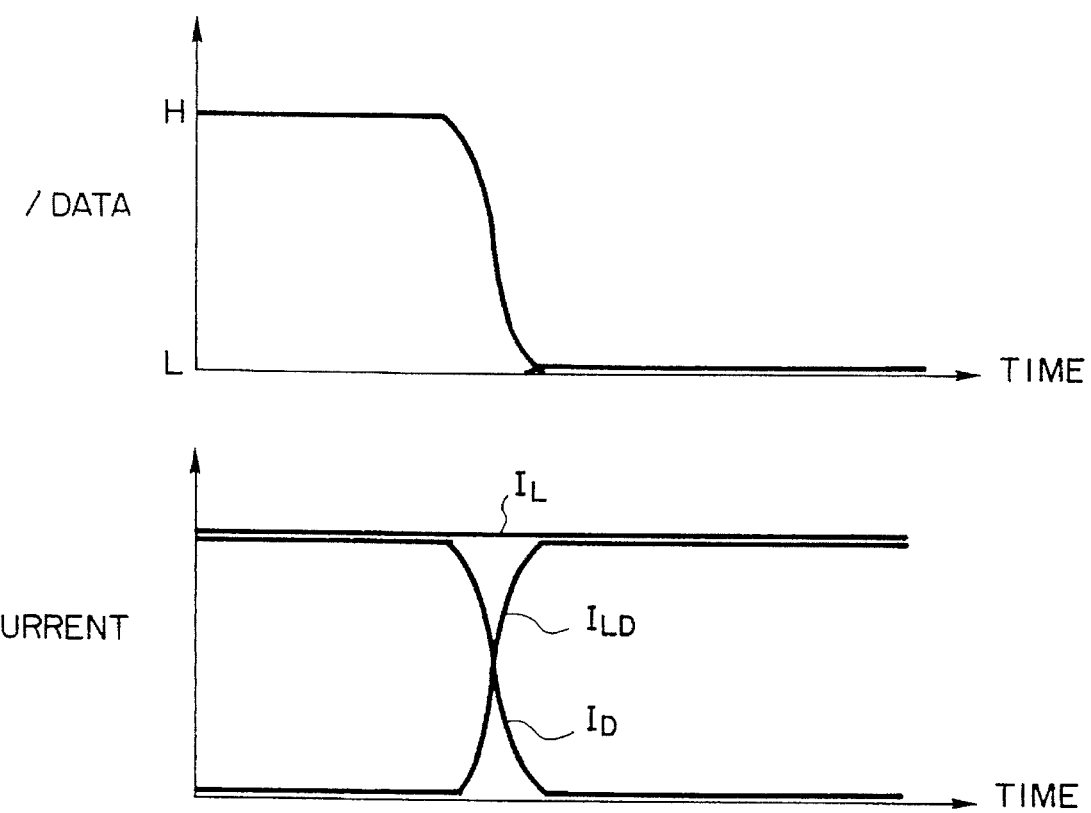
FIG. 23 is a diagram showing a timechart of the current switching of the ninth embodiment.

As shown in a timechart (FIG. 23) of the control, the total current ($I_L$) of the current ($I_{LD}$) flowing to the laser chip 401 side and the current ($L_D$) flowing to the diode 409 side is always constant.

As mentioned above, even in the light-off state of the laser as well, by applying a heat amount that is equal to that in the light-on state of the laser chip 401 to the laser chip 401 from the diode 409, the temperature difference on the chip in the laser light-on and light-off states is reduced as much as possible. A change in laser beam power due to the heat which is generated in the laser light-on state can be reduced.

Figure 24:
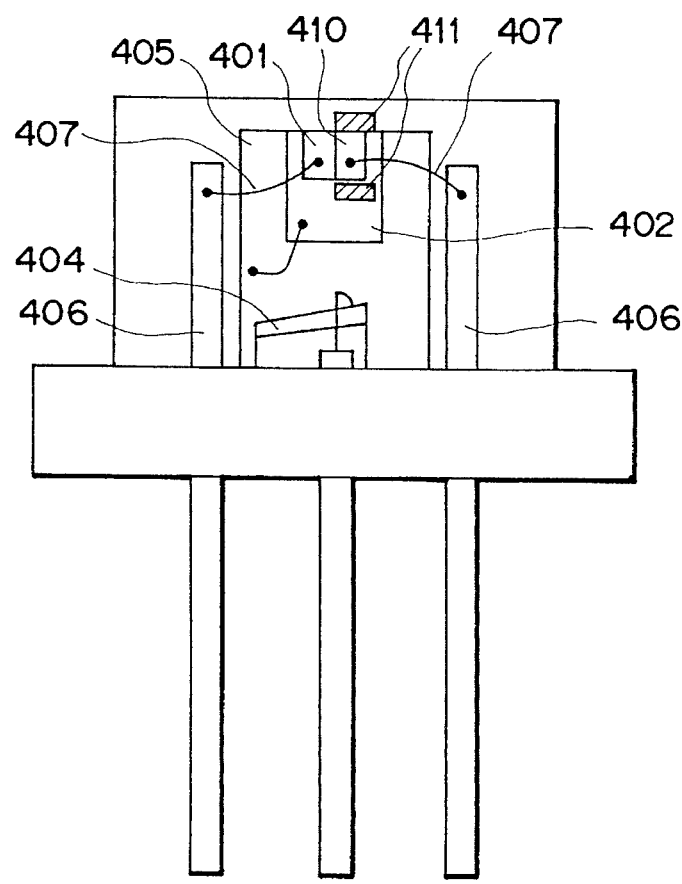
FIG. 24 is a diagram showing a construction of the tenth embodiment.
Figure 25:
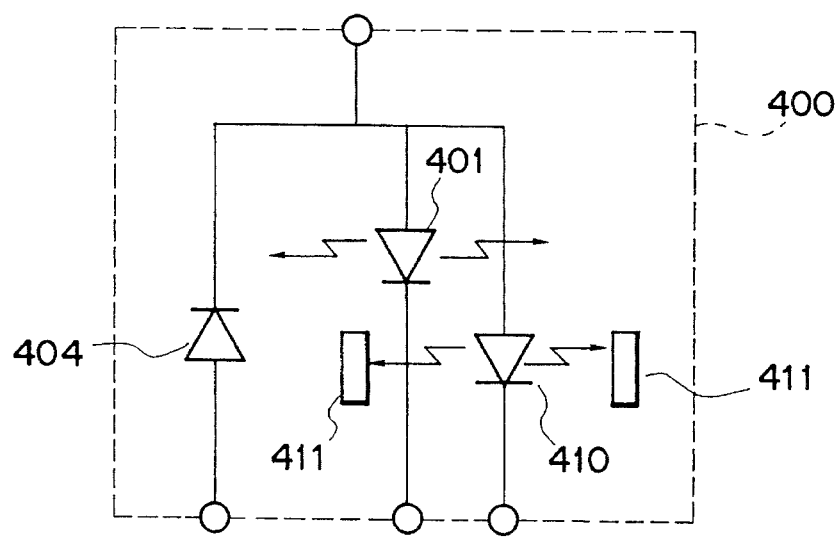
FIG. 25 is an equivalent circuit diagram showing a construction of the tenth embodiment.

FIG. 24 is a constructional diagram of a semiconductor laser devcie of the tenth embodiment according to the invention. The tenth embodiment is characterized in that a second laser chip 410 as heat generating means that is thermally coupled to the laser chip 401 by the submount 402 is provided and, further, a light shielding material 411 is provided to prevent that a laser beam emitted from the second laser chip 410 leaks to the outside of the package and is irradiated to the pin photodiode 404. The other construction is similar to the seventh embodiment. FIG. 25 is an equivalent circuit diagram showing a construction of the embodiment.

As mentioned above, two laser chips 401 and 410 manufactured by the similar processing steps are provided in the same package of the semiconductor laser in a state in which they are thermally coupled. One (401) of laser chips is used to obtain an inherent laser beam and the other (410) is used as heat generating means. Thus, the electric powers which are consumed on a package unit basis in the laser light-on and light-off states can be almost equalized. The temperature difference on the chip in the laser light-on and light-off states can be eliminated. A change in laser beam power due to the heat that is generated in the laser light-on state can be reduced.

As described above, according to the invention, the laser chip and the resistor as heat generating means are provided in the same package of the semiconductor laser. A current is supplied to the heat generating means in the light-off state of the laser. Thus, the temperature difference on the chip in the laser light-on and light-off states is reduced as much as possible. A change in laser beam power due to the heat that is generated in the laser light-on state can be reduced.

What is claimed is:

1. A semiconductor laser device comprising:

a chip;

a laser element formed on said chip, said laser element being operable to emit a laser beam in a first direction; and a heating element formed on the chip, said heating element comprising a heating laser element formed so as not to emit a laser beam in the first direction.

2. A device according to claim 1, wherein said heating element heats the chip.

3. A semiconductor laser device according to claim 1, further comprising a control device for controlling switchover and drive of said laser element and said heating element.

4. A semiconductor laser device comprising:

a chip;

a laser element formed on the chip; and a diode element formed on the chip, wherein when said diode element is connected to a power source to which said laser element is connected, the diode element generates a heat amount which is approximately equal to an amount of heat which is generated when the laser element emits a laser beam.

5. A semiconductor laser device according to claim 4, further comprising a detection element for detecting an emission intensity of said laser element.

6. A semiconductor laser device according to claim 4, further comprising a control device for driving said laser element at a time of laser turn-on and for switching to drive said diode element at the time of laser turn-off.

7. A semiconductor laser device according to claim 4, wherein said diode element is used for heating said chip.

8. A method of driving a semiconductor laser device, comprising the steps of:

forming on a single chip a laser element and a heating laser element which does not emit a laser beam in a direction in which the laser element emits a laser beam;

driving the laser element; and driving the heating laser element when the laser element is not driven.

9. A method according to claim 8, wherein said heating laser element heats said chip when said heating laser element is driven.

10. A method of driving a semiconductor laser device, comprising:

driving a laser element; and driving a diode element formed on the same chip on which said laser element is formed when said laser element is not driven.

11. A method according to claim 10, wherein said diode element heats said chip when said diode element is driven.

12. A method according to claim 10, wherein when said diode element is connected to a power source to which said laser element is connected, said diode element generates a heat amount of which is approximately equal to that generated when said laser element emits laser beam.

* * * * *

UNITED STATES PATENT AND TRADEMARK OFFICE
CERTIFICATE OF CORRECTION

PATENT NO. : 5,488,625

DATED : January 30, 1996

INVENTORS : Tomohiro Nakamori et al.

It is certified that error appears in the above-identified patent and that said Letters Patent is hereby corrected as shown below:

COLUMN 8

Line 11, "if" should read --is--.

COLUMN 12

Line 53, "of" should be deleted, and
Line 54, "emits" should read --emits a--.

Signed and Sealed this

Twenty-fifth Day of June, 1996

Attest:

BRUCE LEHMAN

Attesting Officer     Commissioner of Patents and Trademarks